United States Patent
Shin et al.

(10) Patent No.: US 10,553,260 B2
(45) Date of Patent: Feb. 4, 2020

(54) STACKED MEMORY DEVICE, A SYSTEM INCLUDING THE SAME AND AN ASSOCIATED METHOD

(71) Applicant: SAMSUNG ELECTRONICS CO., LTD., Suwon-si, Gyeonggi-do (KR)

(72) Inventors: Hyun-Sung Shin, Seoul (KR); Ik-Joon Choi, Suwon-si (KR); So-Young Kim, Hwaseong-si (KR); Tae-Kyu Byun, Hwaseong-si (KR); Jae-Youn Youn, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/038,269

(22) Filed: Jul. 18, 2018

(65) Prior Publication Data

US 2019/0096453 A1    Mar. 28, 2019

(30) Foreign Application Priority Data

Sep. 27, 2017  (KR) .................. 10-2017-0125481

(51) Int. Cl.
*G11C 7/10* (2006.01)
*G06F 3/06* (2006.01)
(Continued)

(52) U.S. Cl.
CPC .......... *G11C 7/1078* (2013.01); *G06F 3/0611* (2013.01); *G06F 3/0625* (2013.01);
(Continued)

(58) Field of Classification Search
CPC ........... G11C 7/1078; G11C 7/06; G11C 7/22; G06F 3/0611; G06F 3/0625; G06F 3/0659; G06F 7/523; G06F 12/0646
(Continued)

(56) References Cited

U.S. PATENT DOCUMENTS

| 5,751,987 A | 5/1998 | Mahant-Shetti et al. |
| 7,167,890 B2 | 1/2007 | Lin et al. |

(Continued)

FOREIGN PATENT DOCUMENTS

CN         106782666        5/2017

OTHER PUBLICATIONS

Xu et al. "Scaling Deep Learning on Multiple In-Memory Processors", AMD Research, Advanced Micro Devices, Inc., 2015, 7 pages.

(Continued)

*Primary Examiner* — Harry W Byrne
(74) *Attorney, Agent, or Firm* — F. Chau & Associates, LLC

(57) ABSTRACT

A stacked memory device includes; a logic semiconductor die; a plurality of memory semiconductor dies stacked with the logic semiconductor die, wherein each of the memory semiconductor dies includes a memory integrated circuit and one or more of the memory semiconductor dies is a calculation semiconductor die including a calculation unit; and through-silicon vias electrically connecting the logic semiconductor die and the plurality of memory semiconductor dies, wherein each of the calculation units is configured to perform calculations based on broadcast data and internal data and to generate calculation result data, wherein the broadcast data is commonly provided to the calculation semiconductor dies through the through-silicon vias, and the internal data is respectively read from the memory integrated circuits of the calculation semiconductor dies.

18 Claims, 33 Drawing Sheets

(51) Int. Cl.
  *G06F 7/523* (2006.01)
  *G06F 12/06* (2006.01)
  *G11C 7/06* (2006.01)
  *G11C 7/22* (2006.01)

(52) U.S. Cl.
  CPC ............ *G06F 3/0659* (2013.01); *G06F 7/523* (2013.01); *G06F 12/0646* (2013.01); *G11C 7/06* (2013.01); *G11C 7/22* (2013.01)

(58) Field of Classification Search
  USPC ..................................................... 365/189.05
  See application file for complete search history.

(56) References Cited

U.S. PATENT DOCUMENTS

| | | | |
|---|---|---|---|
| 8,234,460 | B2 | 7/2012 | Walker |
| 8,971,124 | B1 | 3/2015 | Manning |
| 2007/0005876 | A1 | 1/2007 | Ikeda et al. |
| 2007/0126105 | A1 | 6/2007 | Yamada et al. |
| 2014/0244948 | A1 | 8/2014 | Walker et al. |
| 2015/0348603 | A1* | 12/2015 | Lee .................... H03K 19/0005 365/189.07 |
| 2016/0037281 | A1 | 2/2016 | Atkins et al. |
| 2016/0093343 | A1 | 3/2016 | Ovsiannikov et al. |
| 2016/0172015 | A1 | 6/2016 | Manning |
| 2016/0372165 | A1 | 12/2016 | Cowles et al. |
| 2017/0024337 | A1 | 1/2017 | Walker et al. |
| 2017/0148496 | A1* | 5/2017 | Lee .................... H03K 19/0005 |
| 2017/0194039 | A1 | 7/2017 | Funaki |

OTHER PUBLICATIONS

Gu et al., "Biscuit: A Framework for Near-Data Processing of Big Data Workloads", 2016 ACM/IEEE 43rd Annual International Symposium on Computer Architecture, pp. 153-165.

Chi et al., "Prime: A Novel Processing-in-memory Architecture for Neural Network Computation in ReRAM-based Main Memory", 2016 ACM/IEEE 43rd Annual International Symposium on Computer Architecture (ISCA), pp. 27-39.

Search Report dated Jul. 22, 2019 issued from the Singapore Patent Office in the corresponding Singapore Patent Application No. 10201808209U.

* cited by examiner

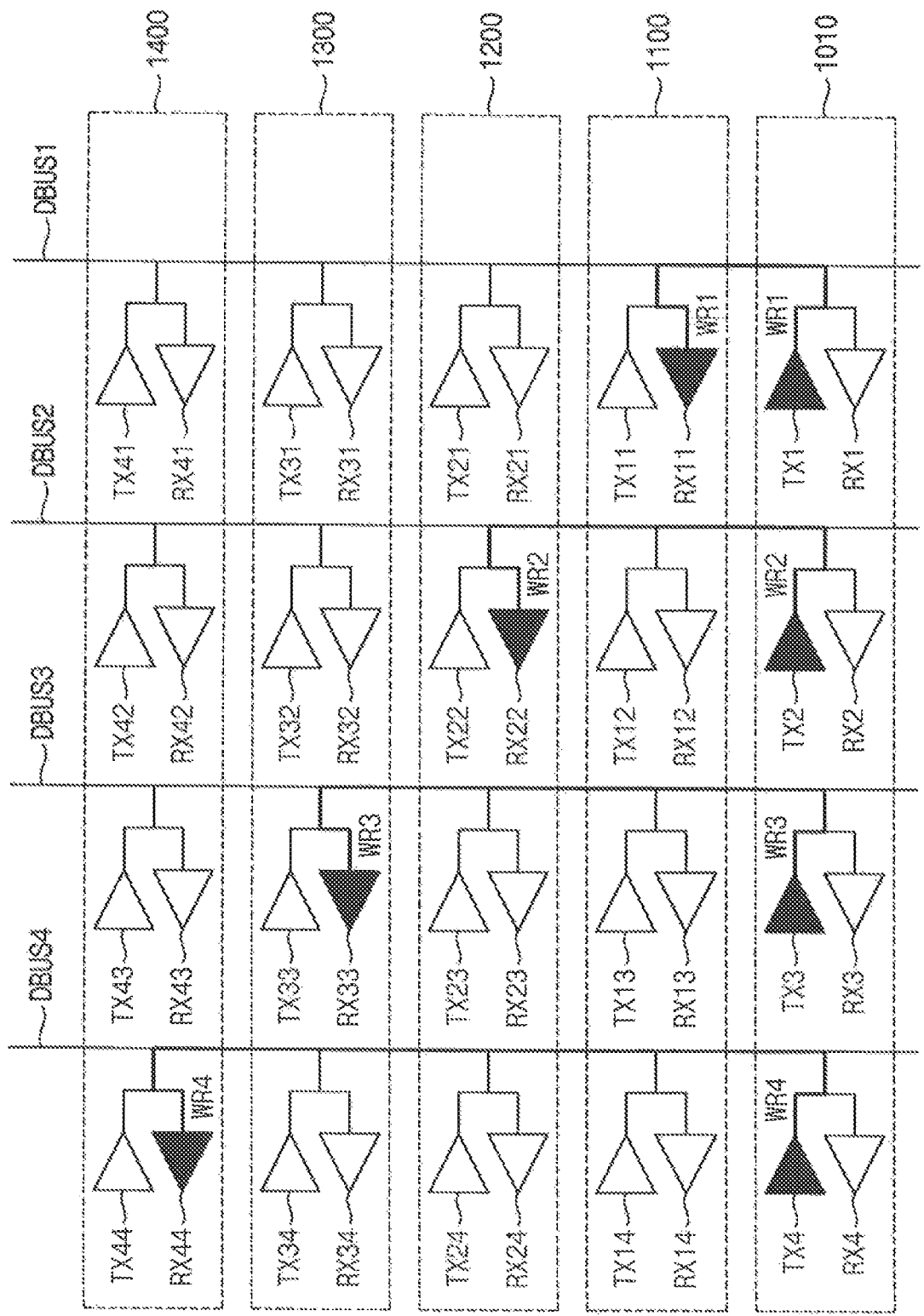

STACKED MEMORY DEVICE, A SYSTEM INCLUDING THE SAME AND AN ASSOCIATED METHOD

CROSS-REFERENCE TO RELATED APPLICATION

This U.S. Non-provisional application claims priority under 35 U.S.C. § 119 to Korean Patent Application No. 10-2017-0125481, filed on Sep. 27, 2017, in the Korean Intellectual Property Office (KIPO), the disclosure of which is incorporated by reference herein in its entirety.

TECHNICAL FIELD

The present inventive concept relates to semiconductor integrated circuits, and more particularly, to a stacked memory device, a system including a stacked memory device and a method of operating a stacked memory device.

DISCUSSION OF THE RELATED ART

Memory bandwidth and latency are performance bottlenecks in many processing systems. Memory capacity may be increased by using a stacked memory device in which a plurality of semiconductor devices are stacked in a memory chip package. The stacked semiconductor devices (or dies) may be electrically connected to each other by through-silicon vias or through-substrate vias (TSVs). Such stacking technology may increase memory capacity and also suppress bandwidth and latency penalties. Each time an external device accesses the stacked memory device, data is communicated between the stacked semiconductor dies. In this case, however, inter-device bandwidth and inter-device latency penalties may happen twice in each access. Accordingly, the inter-device bandwidth and inter-device latency can have a significant impact on processing efficiency and power consumption when the external device requests multiple accesses to the stacked memory device.

SUMMARY

According to an exemplary embodiment of the inventive concept, a stacked memory device includes: a logic semiconductor die; a plurality of memory semiconductor dies stacked with the logic semiconductor die, wherein each of the memory semiconductor dies includes a memory integrated circuit and one or more of the memory semiconductor dies is a calculation semiconductor die including a calculation unit; and through-silicon vias electrically connecting the logic semiconductor die and the plurality of memory semiconductor dies; wherein each of the calculation units is configured to perform calculations based on broadcast data and internal data and to generate calculation result data, wherein the broadcast data is commonly provided to the calculation semiconductor dies through the through-silicon vias, and the internal data is respectively read from the memory integrated circuits of the calculation semiconductor dies.

According to an exemplary embodiment of the inventive concept, a memory system includes: a base substrate: at least one logic semiconductor die stacked on the base substrate; a plurality of memory semiconductor dies stacked on the base substrate or on the logic semiconductor die; and a plurality of calculation units formed in one or more calculation semiconductor dies among the plurality of memory semiconductor dies, wherein each of the calculation units is configured to perform calculations based on broadcast data and internal data and to generate calculation result data, wherein the broadcast data is commonly provided to the calculation semiconductor dies, and the internal data is respectively read from memory integrated circuits of the calculation semiconductor dies.

According to an exemplary embodiment of the inventive concept, a method operating a stacked memory device is provided, the stacked memory device including a calculation unit in each of a plurality of calculation semiconductor dies stacked in a vertical direction, the method including: providing broadcast data, in common, to each of the calculation units through through-silicon vias electrically connecting the calculation semiconductor dies; providing internal data respectively read from memory integrated circuits of the calculation semiconductor dies to each of calculation units; and performing a plurality of calculations based on the broadcast data and the internal data simultaneously using the calculation units.

According to an exemplary embodiment of the inventive concept, a plurality of calculation units is provided, wherein each calculation unit is formed in one of a plurality of vertically stacked semiconductor memory dies, wherein during a calculation operation, a first calculation unit of a first semiconductor memory die is enabled to receive broadcast data from a second semiconductor memory die and internal data from a memory integrated circuit of the first semiconductor memory die, and in response to the broadcast data and the internal data, the first calculation unit generates and outputs calculation result data.

BRIEF DESCRIPTION OF THE DRAWINGS

The above and other features of the present inventive concept will be more clearly understood by describing in detail exemplary embodiments thereof with reference to the accompanying drawings.

FIGS. 8A and 8B are diagrams illustrating implementations of the data transfer path of FIG. 7, according to exemplary embodiments of the inventive concept.

DETAILED DESCRIPTION OF THE EMBODIMENTS

Figure 1:
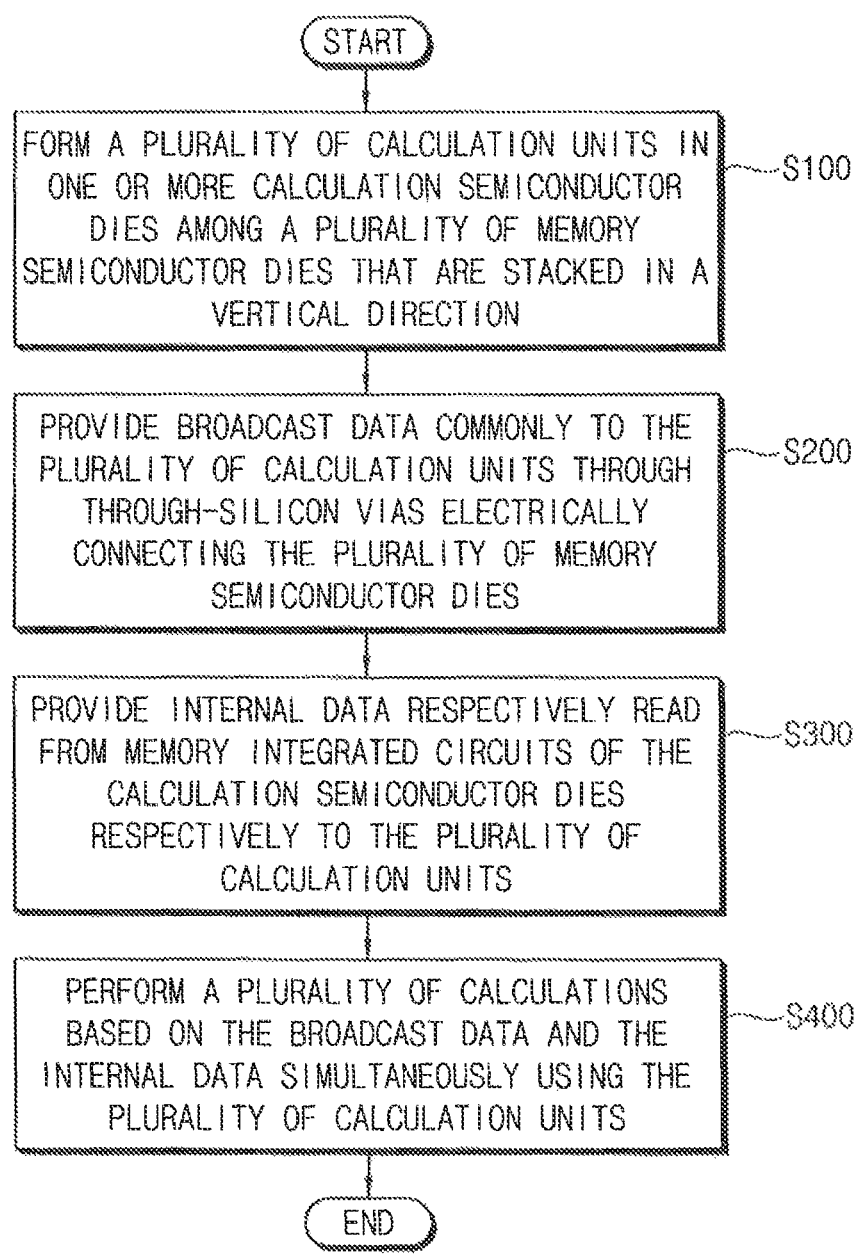
FIG. 1 is a flow chart illustrating a method of operating a stacked memory device according to an exemplary embodiment of the inventive concept.

Exemplary embodiments of the present inventive concept will be described more fully hereinafter with reference to the accompanying drawings. In the drawings, like numerals may refer to like elements.

FIG. 1 is a flow chart illustrating a method of operating a stacked memory device according to an exemplary embodiment of the inventive concept.

Referring to FIG. 1, a plurality of calculation units are formed in one or more calculation semiconductor dies among a plurality of memory semiconductor dies that are stacked in a vertical direction (S100). Broadcast data are provided commonly to the plurality of calculation units by using through-silicon vias electrically connecting the plurality of memory semiconductor dies to each other (S200). Internal data respectively read from memory integrated circuits of the calculation semiconductor dies are provided respectively to the plurality of calculation units (S300). A plurality of calculations are simultaneously performed based on the broadcast data and the internal data by using the plurality of calculation units (S400).

As such, the method of operating a stacked memory device according to the present embodiment may reduce an amount of data exchanged between the stacked memory device, the logic semiconductor die and the external device. For example, memory-intensive or data intensive data processing can be performed in parallel by the plurality of calculation units included in the memory semiconductor die. Therefore, data processing time and power consumption can be reduced.

Figure 2:
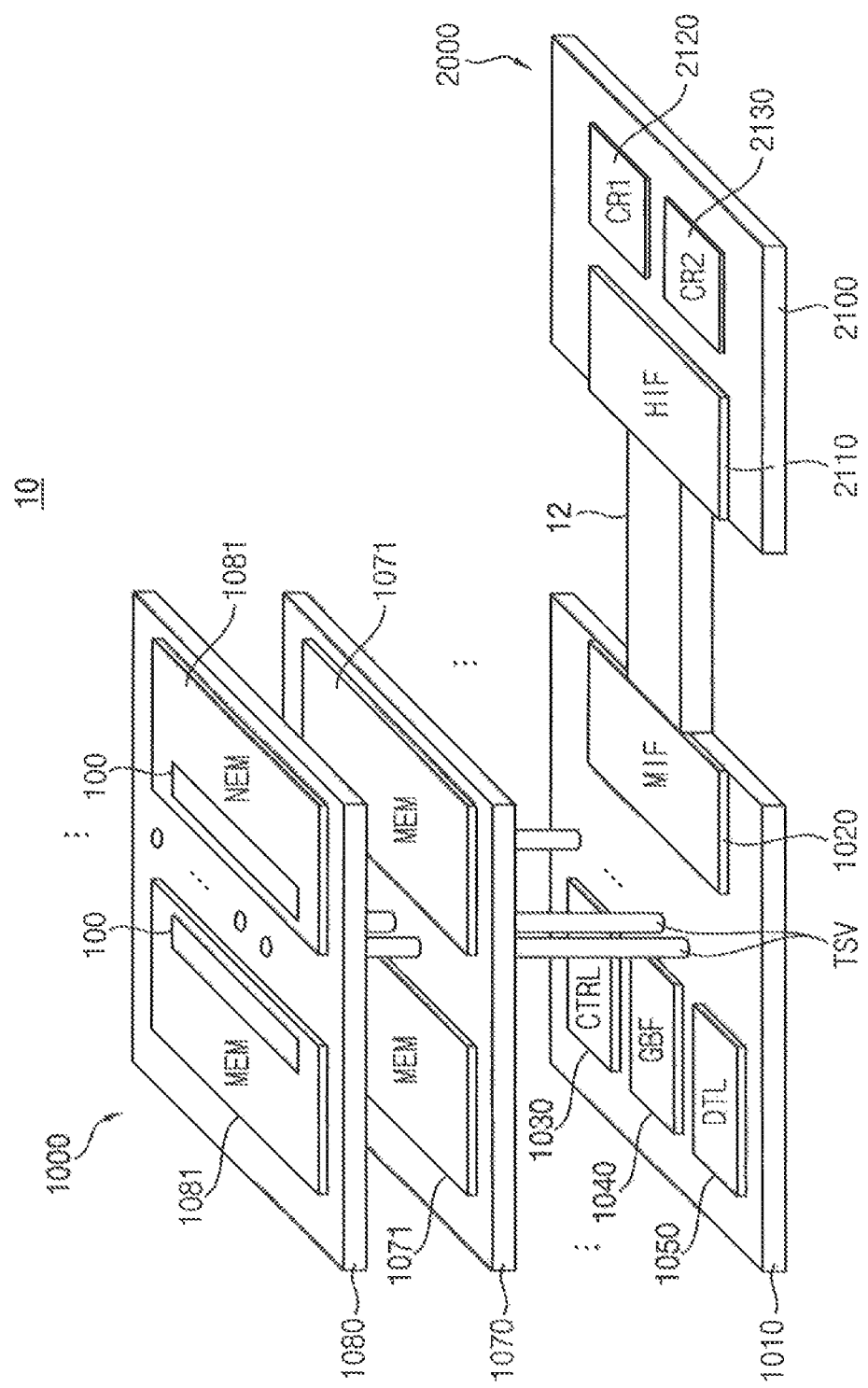
FIG. 2 is an exploded, perspective view, of a system including a stacked memory device according to an exemplary embodiment of the inventive concept.

FIG. 2 is an exploded, perspective view, of a system including a stacked memory device according to an exemplary embodiment of the inventive concept.

Referring to FIG. 2, a system 10 includes a stacked memory device 1000 and a host device 2000.

The stacked memory device 1000 may include a base semiconductor die or a logic semiconductor die 1010 and a plurality of memory semiconductor dies 1070 and 1080 stacked with the logic semiconductor die 1100. FIG. 2 illustrates a non-limiting example of one logic semiconductor die and two memory semiconductor dies. For example, two or more logic semiconductor dies and one, three or more memory semiconductor dies may be included in the stack structure of FIG. 2. In addition, FIG. 2 illustrates a non-limiting example in that the memory semiconductor dies 1070 and 1080 are vertically stacked with the logic semiconductor die 1010. As will be described below with reference to FIG. 29, the memory semiconductor dies 1070 and 1080 may be stacked vertically and the logic semiconductor die 1010 may not be stacked with the memory semiconductor dies 1070 and 1080, but be electrically connected to the memory semiconductor dies 1070 and 1080 through an interposer and/or a base substrate.

The logic semiconductor die 1010 may include a memory interface MIF 1020 and a logic to access memory integrated circuits 1071 and 1081 formed in the memory semiconductor dies 1070 and 1080. The logic may include a control circuit CTRL 1030, a global buffer GBF 1040 and a data transform logic DTL 1050.

The memory interface 1020 may perform communication with an external device such as the host device 2000 through an interconnect device 12. The control circuit 1030 may control overall operations of the stacked memory device 1000. The data transform logic 1050 may perform logic operations on data exchanged with the memory semiconductor dies 1070 and 1080 or data exchanged through the memory interface 1020. For example, the data transform logic 1050 may perform a max pooling, a rectified linear unit (ReLU) operation, a channel-wise addition, etc.

The memory semiconductor dies 1070 and 1080 may include the memory integrated circuits 1071 and 1081, respectively. At least one of the memory semiconductor dies 1070 and 1080 may be a calculation semiconductor die 1080 that includes a calculation circuit 100. As will be described below, the calculation circuit 100 may include one or more calculation blocks and each of the calculation blocks may include one or more calculation units. Each of the calculation units may perform calculations based on broadcast data and internal data to provide calculation result data. For example, the broadcast data may be commonly provided to calculation semiconductor dies by using through-silicon vias TSV, and the internal data may be read from the memory integrated circuit of the corresponding calculation semiconductor die.

The host device 2000 may include a host interface HIF 2110 and processor cores CR1 2120 and CR2 2130. The host interface 2110 may perform communication with an external device such as the stacked memory device 1000 through the interconnect device 12. The components of the host device 2000 may be disposed on a base semiconductor die, a logic semiconductor die, or a substrate 2100 for example.

Figure 3:
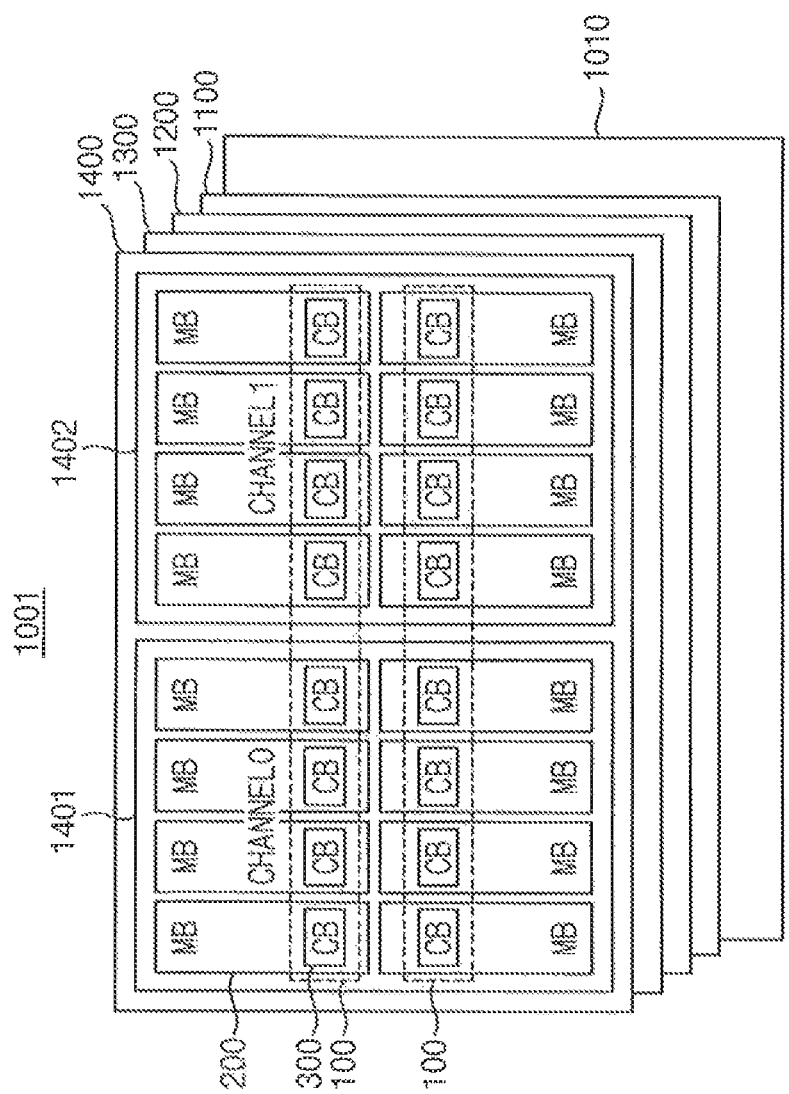
FIG. 3 is a diagram illustrating an example high bandwidth memory (HBM) organization.

FIG. 3 is a diagram illustrating an example high bandwidth memory (HBM) organization.

Referring to FIG. 3, a HBM 1001 may include a stack of multiple dynamic random access memory (DRAM) semiconductor dies 1100, 1200, 1300 and 1400. The HBM of the stack structure may be optimized by a plurality of independent interfaces called channels. Each DRAM stack may support up to 8 channels in accordance with the HBM standards. FIG. 3 shows an example stack containing 4 DRAM semiconductor dies 1100, 1200, 1300 and 1400, and each DRAM semiconductor die supports two channels CHANNEL0 and CHANNEL1. For example, as illustrated in FIG. 3, the fourth memory semiconductor die 1400 may include two memory integrated circuits 1401 and 1402 corresponding to the two channels CHANNEL0 and CHANNEL1.

The fourth memory semiconductor die 1400, for example, may correspond to a calculation semiconductor die including calculation units. Each of the memory integrated circuits 1401 and 1402 may include a plurality of memory banks MB, and each memory bank MB may include a calculation block CB. As will be described with reference to FIG. 4, each calculation block CB may include a plurality of calculation units CU. As such, the calculation units may be distributively arranged in the memory banks MB of the calculation semiconductor die.

Each channel, e.g., CHANNEL0 and CHANNEL1, provides access to an independent set of DRAM banks. Requests from one channel may not access data attached to a different channel. Channels are independently clocked, and need not be synchronous. Each of the memory semiconductor dies 1100, 1200, 1300 and 1400 of the HBM 1001 may access another one of the memory semiconductor dies 1100, 1200, 1300 and 1400 to transfer the broadcast data and/or the calculation result data.

The HBM 1001 may further include an interface die 1010 or a logic semiconductor die disposed at bottom of the stack structure to provide signal routing and other functions. Some functions of the DRAM semiconductor dies 1100, 1200, 1300 and 1400 may be implemented in the interface die 1010.

Figure 4:
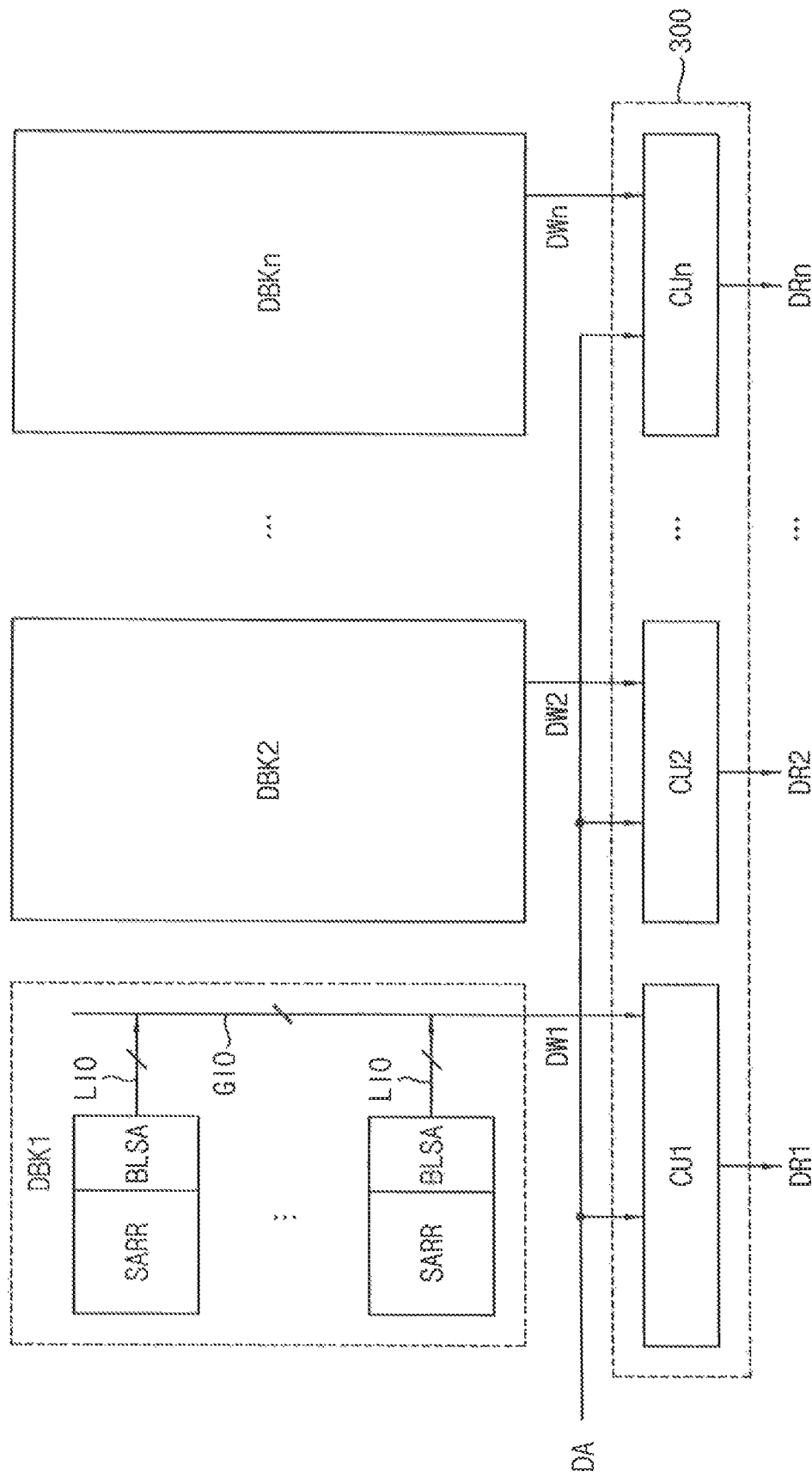
FIG. 4 is a diagram illustrating a memory bank included in the stacked memory device of FIG. 2, according to an exemplary embodiment of the inventive concept.

FIG. 4 is a diagram illustrating a memory bank included in the stacked memory device of FIG. 2, according to an exemplary embodiment of the inventive concept.

Referring to FIG. 4, a memory bank 200 may include a plurality of data blocks DBK1~DBKn and a calculation block 300. FIG. 4 illustrates a configuration of a first data block DBK1 as an example. The other data blocks DBK2~DBKn in FIG. 4 may have the same configuration as the first data block DBK1. Each data block may include a plurality of sub memory cell arrays SARR and each sub memory cell array SARR may include a plurality of memory cells. In a read operation, bit line sense amplifiers BLSA may sense and amplify data stored in the memory cells to sequentially provide the read data to the outside of the memory bank (e.g., an external device) via local input-output lines LIO and global input-output lines GIO. In a write operation, the data provided from the outside of the memory bank (e.g., an external device) may be sequentially stored in the memory cells via the global input-output lines GIO and the local input-output lines LIO.

The calculation block 300 may include a plurality of calculation units CU1~CUn. FIG. 4 illustrates a non-limiting example in which one calculation unit is assigned per data block, but in accordance with an exemplary embodiment of the inventive concept one calculation unit may be assigned per two or more data blocks. As described above, the calculation units CU1~CUn may perform the calculations simultaneously based on broadcast data DA and internal data DW1~DWn. The broadcast data DA being provided commonly to the calculation units CU1~CUn and the internal data DW1~DWn being read respectively from the data blocks DBK1~DBKn of the corresponding memory bank.

Even though an example disposition of the calculation units is described with respect to one memory bank in FIG. 4, the stacked memory device may include a plurality of calculation semiconductor dies, each calculation semiconductor die may include a plurality of memory banks and the calculation units may be disposed as shown in FIG. 4 to correspond to all of the memory banks. All of the calculation units of all memory banks may receive the common broadcast data and the internal data from their corresponding data blocks. As such, an amount of data exchanged between the stacked memory device, the logic semiconductor die and the external device may be reduced. For example, memory-intensive or data intensive data processing can be performed in parallel by the plurality of calculation units that are distributed in the memory semiconductor die. Therefore, data processing time and power consumption can be reduced.

Figure 5:
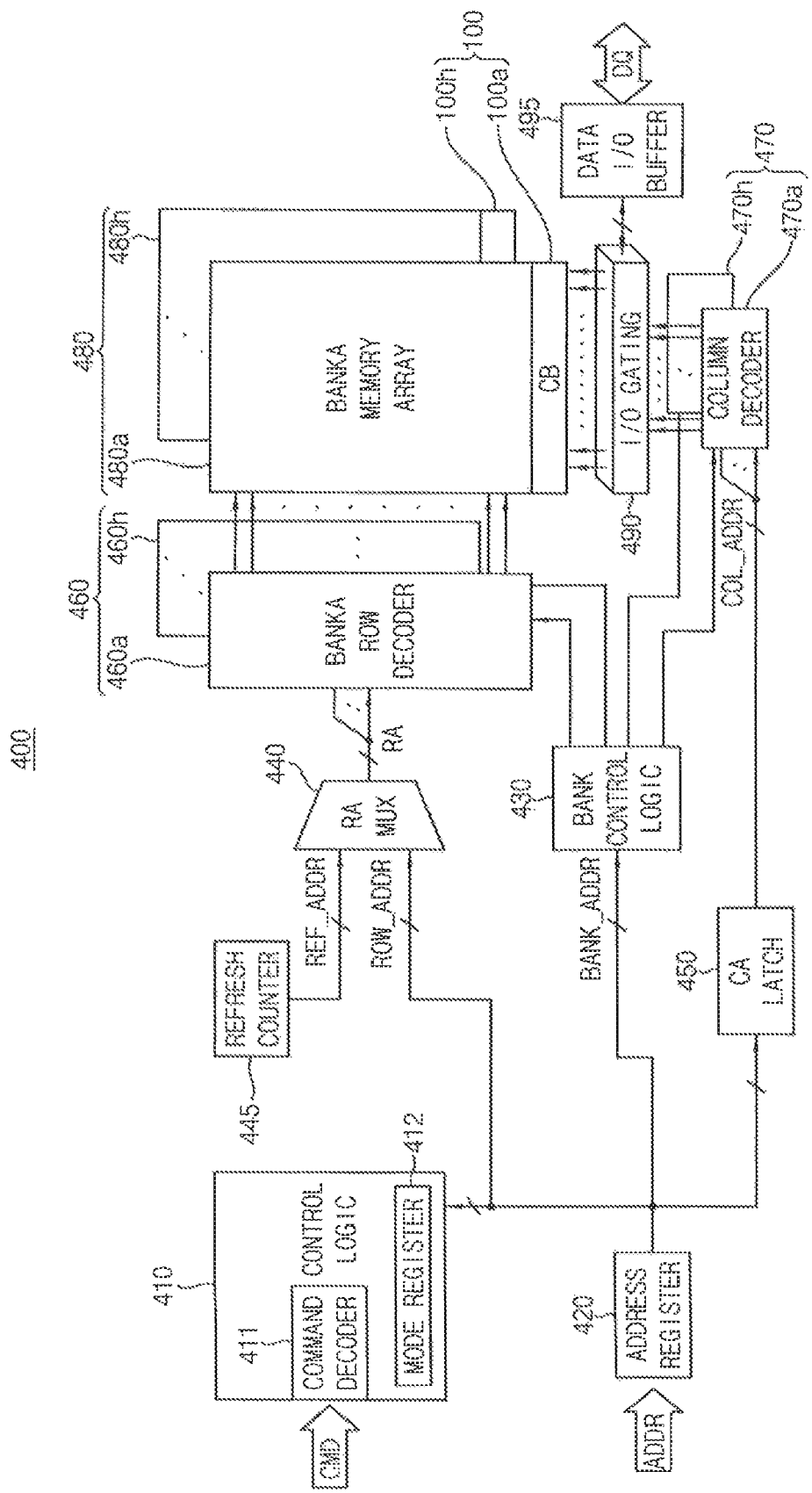
FIG. 5 is a diagram illustrating a memory integrated circuit included in a memory semiconductor die of the stacked memory device of FIG. 2, according to an exemplary embodiment of the inventive concept.

FIG. 5 is a diagram illustrating a memory integrated circuit, according to an exemplary embodiment of the inventive concept.

A DRAM is described as an example of the memory integrated circuits formed in the memory semiconductor dies with reference to FIG. 5. The stacked memory device may be any of a variety of memory cell architectures, including, but not limited to, volatile memory architectures such as DRAM, thyristor RAM (TRAM) and static RAM (SRAM), or non-volatile memory architectures, such as read only memory (ROM), flash memory, ferroelectric RAM (FRAM), magnetoresistive RAM (MRAM), and the like. Referring to FIG. 5, a memory integrated circuit 400 includes a control logic 410, an address register 420, a bank control logic 430, a row address multiplexer 440, a column address latch 450, a row decoder 460, a column decoder 470, a memory cell array 480, a calculation circuit 100, an input/output (I/O) gating circuit 490, a data input/output (I/O) buffer 495 and a refresh counter 445.

The memory cell array 480 may include a plurality of bank arrays 480*a*~480*h*. The row decoder 460 may include a plurality of bank row decoders 460*a*~460*h* respectively coupled to the bank arrays 480*a*~480*h*, and the column decoder 470 may include a plurality of bank column decoders 470*a*~470*h* respectively coupled to the bank arrays 480*a*~480*h*. The calculation circuit 100 may include a plurality of calculation blocks CB 100*a*-100*h* respectively coupled to the bank arrays 480*a*~480*h*.

As described above, each of the calculation blocks 100*a*~100*h* may include a plurality of calculation units that receive the common broadcast data and the respective internal data from the bank arrays 480*a*~480*h*.

The address register 420 may receive an address ADDR including a bank address BANK_ADDR, a row address ROW_ADDR and a column address COL_ADDR from a memory controller. The address register 420 may provide the received bank address BANK_ADDR to the bank control logic 430, may provide the received row address ROW_ADDR to the row address multiplexer 440, and may provide the received column address COL_ADDR to the column address latch 450.

The bank control logic 430 may generate bank control signals in response to the bank address BANK_ADDR. One of the bank row decoders 460*a*~460*h* corresponding to the bank address BANK_ADDR may be activated in response to the bank control signals, and one of the bank column decoders 470*a*~470*h* corresponding to the bank address BANK_ADDR may be activated in response to the bank control signals.

The row address multiplexer 440 may receive the row address ROW_ADDR from the address register 420, and may receive a refresh row address REF_ADDR from the refresh counter 445. The row address multiplexer 440 may selectively output the row address ROW_ADDR or the refresh row address REF_ADDR as a row address RA. The row address RA that is output from the row address multiplexer 440 may be applied to the bank row decoders 460*a*~460*h*.

The activated one of the bank row decoders 460*a*~460*h* may decode the row address RA that is output from the row address multiplexer 440, and may activate a word-line corresponding to the row address RA. For example, the activated bank row decoder may apply a word-line driving voltage to the word-line corresponding to the row address RA.

The column address latch 450 may receive the column address COL_ADDR from the address register 420, and may temporarily store the received column address COL_ADDR. In an exemplary embodiment of the inventive concept, in a burst mode, the column address latch 450 may generate column addresses that increment from the received column address COL_ADDR. The column address latch 450 may apply the temporarily stored or generated column address to the bank column decoders 470a~470h.

The activated one of the bank column decoders 470a~470h may decode the column address COL_ADDR that is output from the column address latch 450, and may control the input/output gating circuit 490 to output data corresponding to the column address COL_ADDR. The I/O gating circuit 490 may include circuitry for gating input/output data. The I/O gating circuit 490 may further include read data latches for storing data that is output from the bank arrays 480a~480h, and write drivers for writing data to the bank arrays 480a~480h.

Data to be read from one bank array of the bank arrays 480a~480h may be sensed by one of bank sense amplifiers coupled to the one bank array from which the data is to be read, and may be stored in read data latches. The data stored in the read data latches may be provided to the memory controller via the data I/O buffer 495. Data DQ to be written in one bank array of the bank arrays 480a~480h may be provided to the data I/O buffer 495 from the memory controller. The write driver may write the data DQ in one bank array of the bank arrays 480a~480h.

The control logic 410 may control operations of the memory integrated circuit 400. For example, the control logic 410 may generate control signals for the memory integrated circuit 400 to perform a write operation or a read operation. The control logic 410 may include a command decoder 411 that decodes a command CMD received from the memory controller and a mode register set 412 that sets an operation mode of the memory integrated circuit 400. For example, the command decoder 411 may generate the control signals corresponding to the command CMD by decoding a write enable signal, a row address strobe signal, a column address strobe signal, a chip selection signal, etc.

Figure 6:
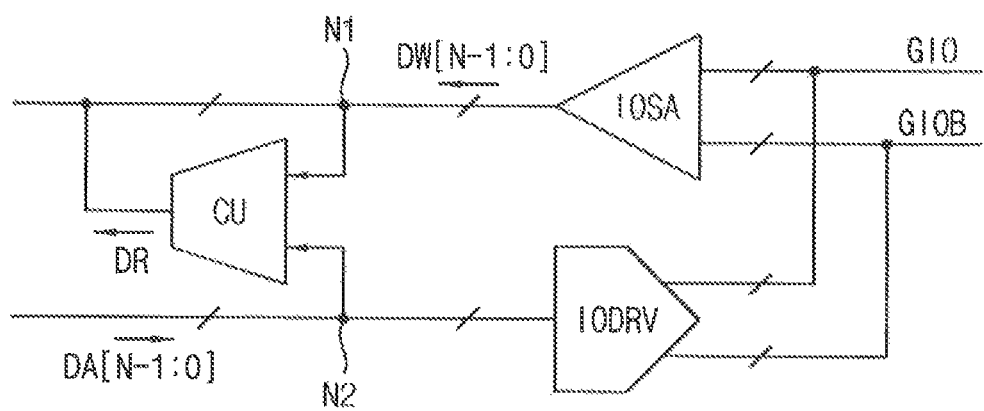
FIG. 6 is a diagram illustrating a calculation unit, according to an exemplary embodiment of the inventive concept.

FIG. 6 is a diagram illustrating a calculation unit, according to an exemplary embodiment of the inventive concept.

Referring to FIG. 6, each calculation unit CU may include first input terminals connected to first nodes N1 receiving internal data DW[N-1:0] and second input terminals connected to second nodes N2 receiving the broadcast data DA[N-1:0]. The first nodes N1 are connected to output terminals of an input-output sense amplifier IOSA that amplifies signals on global input-output lines GIO and GIOB to output amplified signals. The second nodes N2 are connected to input terminals of an input-output driver IODRV that drives the global input-output lines GIO and GIOB.

During a normal read operation, the calculation unit CU is disabled and the input-output sense amplifier IOSA amplifies the read data provided through the global input-output lines GIO and GIOB to provide the amplified signals to the outside. During a normal write operation, the calculation unit CU is disabled and the input-output driver IODRV drives the global input-output lines GIO and GIOB based on the write data provided from the outside. During a calculation operation, the calculation unit CU is enabled to receive the broadcast data DA[N-1:0] and the internal data DW[N-1:0]. In this case, the input-output sense amplifier IOSA is enabled to output the internal data DW[N-1:0] and the input-output driver IODRV is disabled to prevent the broadcast data DA[N-1:0] from being provided to internal memory cells.

In an exemplary embodiment of the inventive concept, as illustrated in FIG. 6, the output terminals of the calculation unit CU providing the calculation result data DR may be connected to the first nodes N1, in other words, the output terminals of the input-output sense amplifiers IOSA. Thus the calculation result data DR may be provided to the outside through the normal read path. The input-output sense amplifier IOSA is disabled while the calculation unit CU provides the calculation result data DR. In an exemplary embodiment of the inventive concept, the output terminals of the calculation unit CU may not be connected to the first nodes N1 and the calculation result data DR may be provided through an additional data path distinct from the normal read path. In an exemplary embodiment of the inventive concept, the output nodes of the calculation unit CU may be connected to the second nodes N2 to store the calculation result data DR in the memory cells through the normal write path.

FIG. 6 illustrates a differential global line pair GIO and GIOB for convenience of illustration; however, each calculation unit CU may be connected to N global line pairs to receive N-bit broadcast data DA[N-1:0] and N-bit internal data DW[N-1:0]. For example, N may be 8, 16 or 21 depending on operation modes of the stacked memory device.

Hereinafter, data transfer paths of a stacked memory device according to exemplary embodiments of the inventive concept are described with reference to FIGS. 7 through 24. Even though one logic semiconductor die 1010 and first through fourth memory semiconductor dies 1100, 1200, 1300 and 1400 are illustrated in FIGS. 7 through 24, the numbers of the logic semiconductor dies and the memory semiconductor dies may be different.

Figure 7:
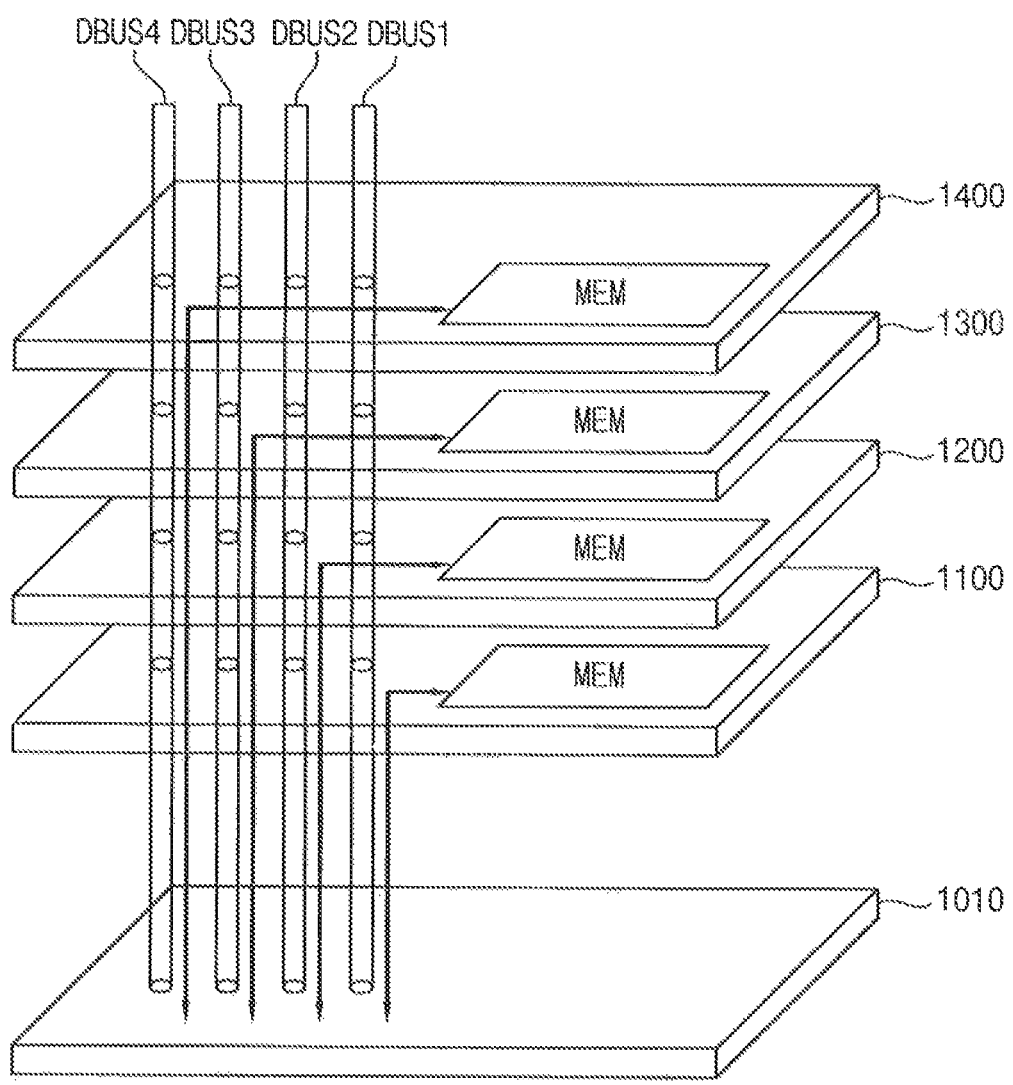
FIG. 7 is a diagram illustrating a data transfer path during a normal access operation in a stacked memory device according to an exemplary embodiment of the inventive concept.
Figure 8B:
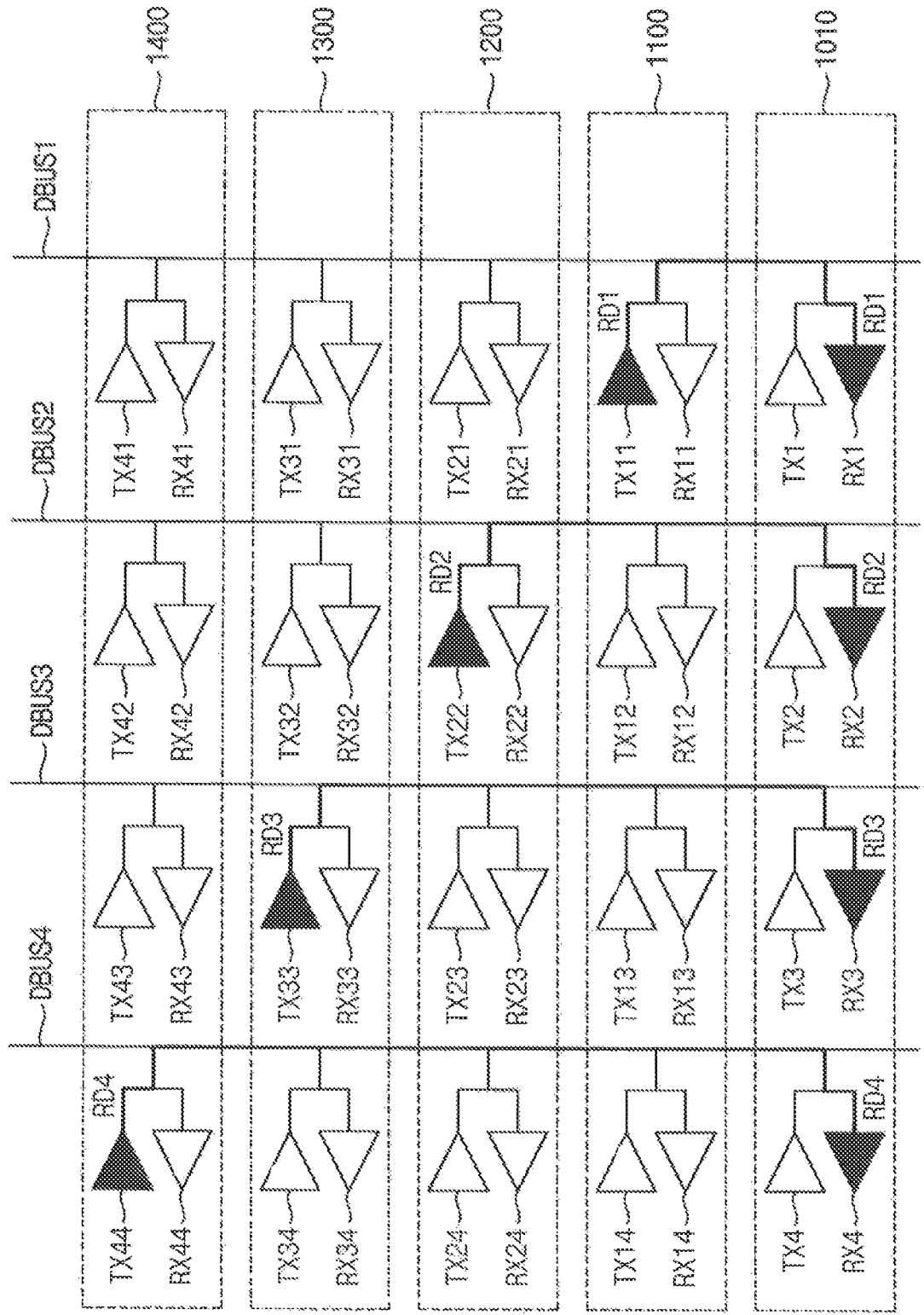

FIG. 7 is a diagram illustrating a data transfer path during a normal access operation in a stacked memory device according to an exemplary embodiment of the inventive concept, and FIGS. 8A and 8B are diagrams illustrating implementations of the data transfer path of FIG. 7, according to exemplary embodiments of the inventive concept.

Referring to a stacked memory device of FIG. 7, data may be exchanged between the logic semiconductor die 1010 and the first through fourth memory semiconductor dies 1100, 1200, 1300 and 1400 through first through fourth data buses DBUS1~DBUS4 respectively corresponding to the first through fourth memory semiconductor dies 1100, 1200, 1300 and 1400. In other words, during normal read and write operations, data may be exchanged between the logic semiconductor die 1010 and the first memory semiconductor die 1100 through the first data bus DBUS1, data may be exchanged between the logic semiconductor die 1010 and the second memory semiconductor die 1200 through the second data bus DBUS2, data may be exchanged between the logic semiconductor die 1010 and the third memory semiconductor die 1300 through the third data bus DBUS3, and data may be exchanged between the logic semiconductor die 1010 and the fourth memory semiconductor die 1400 through the fourth data bus DBUS4. During the normal read and write operations, data may not be exchanged between the memory semiconductor dies 1100, 1200, 1300 and 1400.

Each of the data buses DBUS1~DBUS4 may include a plurality of data paths and each data path may extend in the vertical direction by connecting the through-silicon vias respectively formed in the memory semiconductor dies 1100, 1200, 1300 and 1400.

Referring to FIGS. 8A and 8B, the logic semiconductor die 1010 and the memory semiconductor dies 1100, 1200, 1300 and 1400 may include transmission circuits TX and reception circuits RX, respectively, to perform bi-directional communication through the data buses DBUS1~DBUS4. The transmission circuits TX and the reception circuits RX corresponding to the first through fourth data buses DBUS1~DBUS4 may be formed in all of the memory semiconductor dies 1100, 1200, 1300 and 1400. This may provide for uniform manufacturing process. Further, the transmission circuits TX and the reception circuits RX may be enabled selectively for a required data communication.

FIG. 8A illustrates a data transfer path corresponding to a normal write operation and FIG. 8B illustrates a data transfer path corresponding to a normal read operation.

Referring to FIG. 8A, during the normal write operation, the transmission circuits TX of the logic semiconductor die 1010 and the reception circuits RX of the memory semiconductor dies 1100, 1200, 1300 and 1400 may be enabled to transfer write data from the logic semiconductor die 1010 to the memory semiconductor dies 1100, 1200, 1300 and 1400 through the data buses DBUS1~DBUS4, respectively.

A first transmission circuit TX1 of the logic semiconductor die 1010 and a first reception circuit RX11 of the first memory semiconductor die 1100 may be enabled to transfer first write data WR1 through the first data bus DBUS1. A second transmission circuit TX2 of the logic semiconductor die 1010 and a second reception circuit RX22 of the second memory semiconductor die 1200 may be enabled to transfer second write data WR2 through the second data bus DBUS2. A third transmission circuit TX3 of the logic semiconductor die 1010 and a third reception circuit RX33 of the third memory semiconductor die 1300 may be enabled to transfer third write data WR3 through the third data bus DBUS3. A fourth transmission circuit TX4 of the logic semiconductor die 1010 and a fourth reception circuit RX44 of the fourth memory semiconductor die 1400 may be enabled to transfer fourth write data WR4 through the fourth data bus DBUS4. In FIG. 8A, bold transmission and reception circuits indicate they are enabled.

Referring to FIG. 8B, during the normal read operation, the transmission circuit TX of the memory semiconductor dies 1100, 1200, 1300 and 1400 and the reception circuit RX of the logic semiconductor die 1010 may be enabled to transfer read data from the memory semiconductor dies 1100, 1200, 1300 and 1400 to the logic semiconductor die 1010 through the data buses DBUS1~DBUS4, respectively.

A first transmission circuit TX11 of the first memory semiconductor die 1100 and a first reception circuit RX1 of the logic semiconductor die 1010 may be enabled to transfer first read data RD1 through the first data bus DBUS1. A second transmission circuit TX22 of the second memory semiconductor die 1200 and a second reception circuit RX2 of the logic semiconductor die 1010 may be enabled to transfer second read data RD2 through the second data bus DBUS2. A third transmission circuit TX33 of the third memory semiconductor die 1300 and a third reception circuit RX3 of the logic semiconductor die 1010 may be enabled to transfer third read data RD3 through the third data bus DBUS3. A fourth transmission circuit TX44 of the fourth memory semiconductor die 1400 and a fourth reception circuit RX4 of the logic semiconductor die 1010 may be enabled to transfer fourth read data RD4 through the fourth data bus DBUS4. In FIG. 8B, bold transmission and reception circuits indicate they are enabled.

As such, during the normal read and write operations, the data may be transferred through the data buses DBUS1~DBUS4 respectively corresponding to the memory semiconductor dies 1100, 1200, 1300 and 1400. FIGS. 9 through 24 illustrate data transfer paths for a calculation operation according to exemplary embodiments of the inventive concept. In FIGS. 9 through 24 certain configurations and operations are the same as those shown and described with reference to FIGS. 7, 8A and 8B, and thus, repeated descriptions may be omitted.

Figure 9:
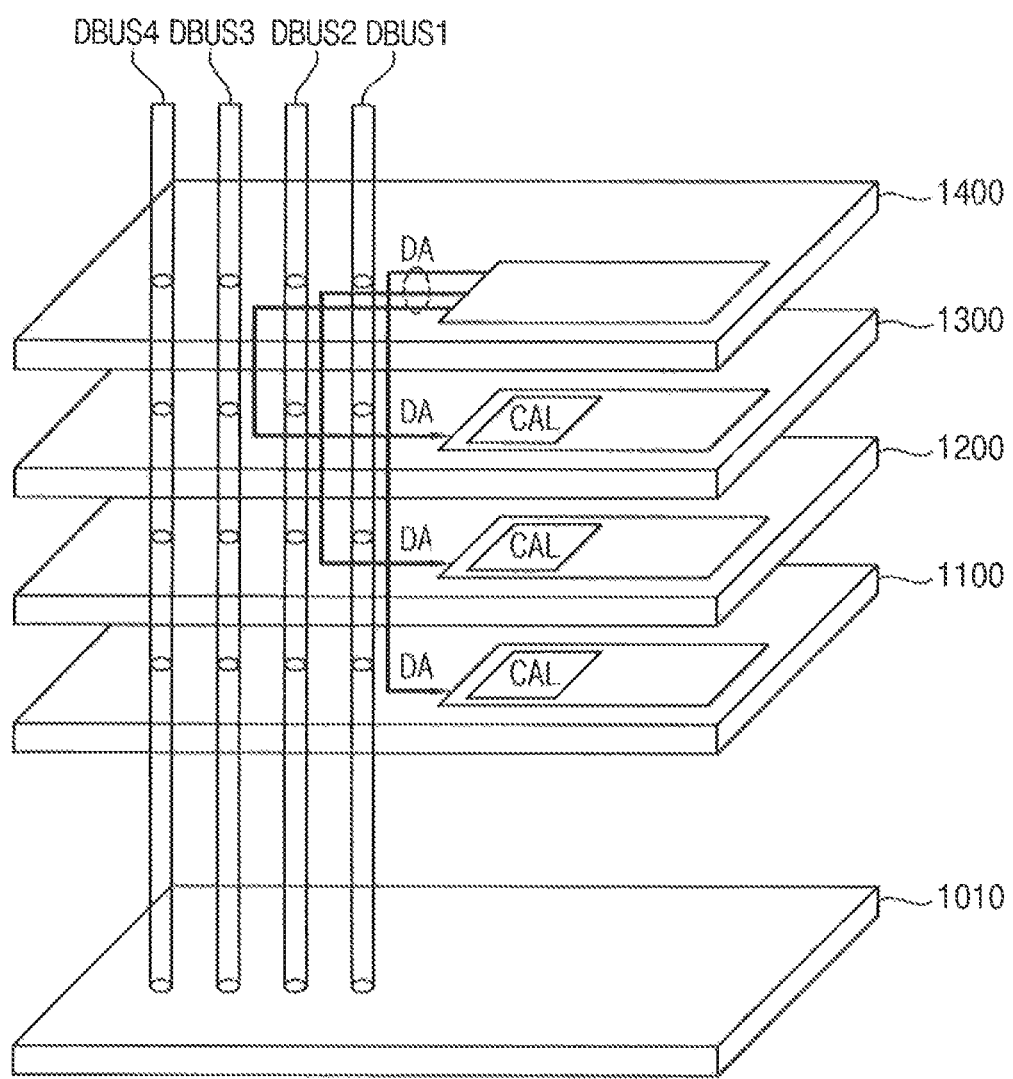
FIGS. 9, 10, 11A, 11B, 12, 13, 14A, 14B and 14C are diagrams illustrating a transfer path of broadcast data in a stacked memory device according to exemplary embodiments of the inventive concept.
Figure 10:
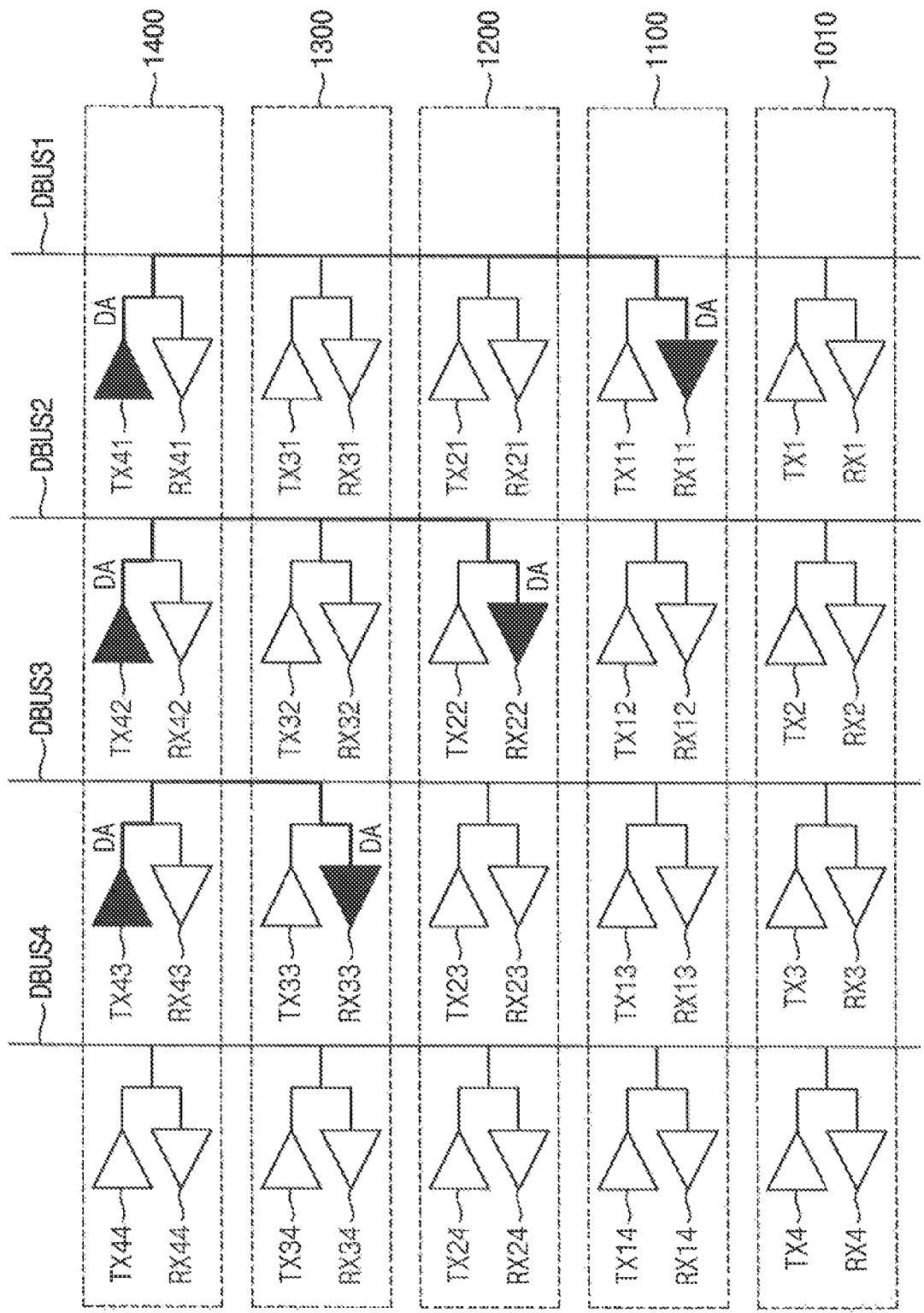

FIG. 9 is a diagram illustrating a data transfer path of broadcast data in a stacked memory device according to an exemplary embodiment of the inventive concept, and FIG. 10 is a diagram illustrating an implementation of the data transfer path of FIG. 9, according to an exemplary embodiment of the inventive concept.

Some of the stacked memory semiconductor dies 1100, 1200, 1300 and 1400 may be a calculation semiconductor die that includes a calculation circuit CAL and other stacked memory semiconductor dies may be an input-output semiconductor die that does not include the calculation circuit CAL. FIG. 9 illustrates a non-limiting example in which first, second and third memory semiconductor dies 1100, 1200 and 1300 are the calculation semiconductor dies and the fourth memory semiconductor die 1400 is the input-output semiconductor die.

Referring to FIG. 9, broadcast data DA may be transferred directly from the input-output semiconductor die 1400 to the calculation semiconductor dies 1100, 1200 and 1300 without passing through the logic semiconductor die 1010. The input-output semiconductor die 1400 may simultaneously drive the data buses DBUS1~DBUS4 respectively corresponding to the memory semiconductor dies 1100, 1200, 1300 and 1400 with the broadcast data DA. The calculation semiconductor dies 1100, 1200 and 1300 may receive the broadcast data DA through the data buses DBUS1~DBUS3 respectively corresponding to the calculation semiconductor dies 1100, 1200 and 1300.

Referring to FIG. 10, a first transmission circuit TX41 of the input-output semiconductor die 1400 and a first reception circuit RX11 of the first calculation semiconductor die 1100 may be enabled to transfer the broadcast data DA through the first data bus DBUS1. A second transmission circuit TX42 of the input-output semiconductor die 1400 and a second reception circuit RX22 of the second calculation semiconductor die 1200 may be enabled to transfer the broadcast data DA through the second data bus DBUS2. A third transmission circuit TX43 of the input-output semiconductor die 1400 and a third reception circuit RX33 of the third calculation semiconductor die 1300 may be enabled to transfer the broadcast data DA through the third data bus DBUS3.

Figure 11A:
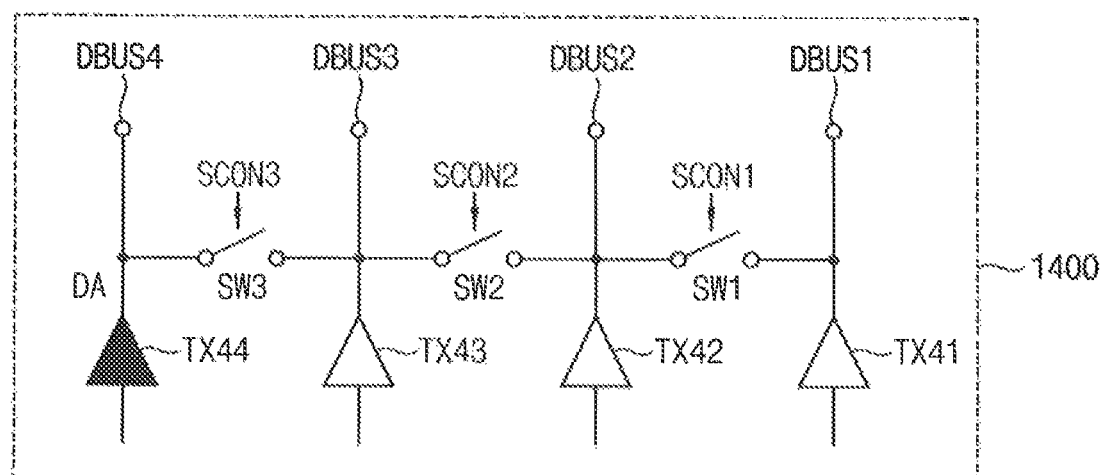
Figure 11B:
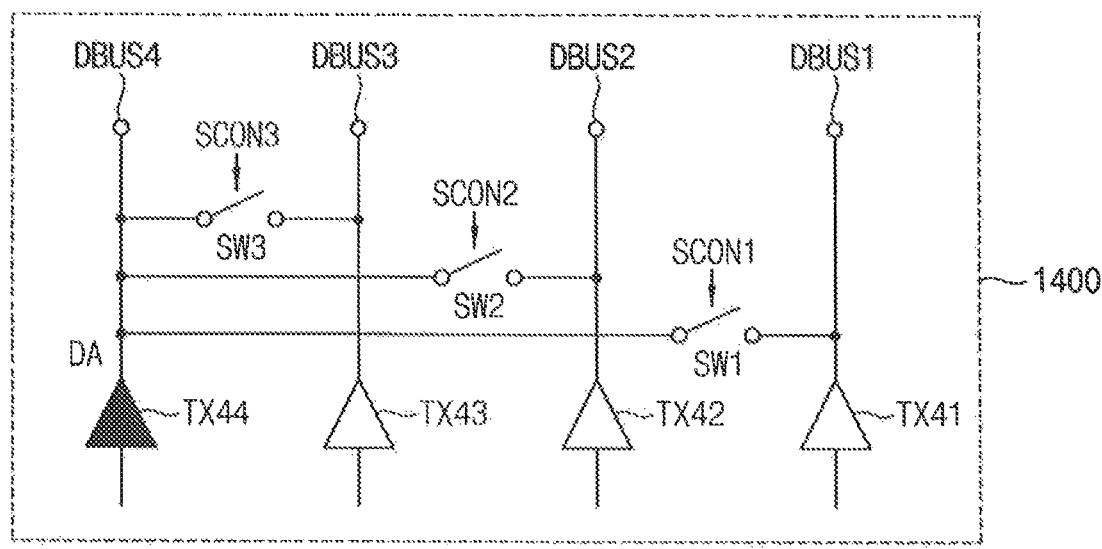

In the embodiment of FIG. 10, the broadcast data DA are transferred by the selective enable of the transmission circuit and the reception circuit. In the embodiments of FIGS. 11A and 11B, the broadcast data DA may be transferred by selective connection of the data buses.

FIGS. 11A and 11B are diagrams illustrating implementations of the data transfer path of FIG. 9, according to an exemplary embodiment of the inventive concept.

Referring to FIG. 11A, switch circuits SW1, SW2 and SW3 may be connected between the adjacent data buses DBUS1~DBUS4. The switch circuits SW1, SW2 and SW3 are turned on in response to switch control signals SCON1, SCON2 and SCON3, respectively. All of the data buses DBUS1~DBUS4 may be electrically connected when all of the switch circuits SW1, SW2 and SW3 are turned on. In this case, the broadcast data DA may be transferred to the calculation semiconductor dies 1100, 1200 and 1300 through the first, second and third data buses DBUS1, DBUS2 and DBUS3 even though the input-output semiconductor die 1400 drives only the fourth data bus DBUS4 corresponding to the input-output semiconductor die 1400.

Referring to FIG. 11B, switch circuits SW1, SW2 and SW3 may be connected between the fourth data bus DBUS4 corresponding to the input-output semiconductor die 1400 and each of the data buses DBUS1, DBUS2 and DBUS3 respectively corresponding to the calculation semiconductor dies 1100, 1200 and 1300. The switch circuits SW1, SW2 and SW3 are turned on in response to switch control signals SCON1, SCON2 and SCON3, respectively. All of the data buses DBUS1~DBUS4 may be electrically connected when all of the switch circuits SW1, SW2 and SW3 are turned on. In this case, the broadcast data DA may be transferred to the calculation semiconductor dies 1100, 1200 and 1300 through the first, second and third data buses DBUS1, DBUS2 and DBUS3 even though the input-output semiconductor die 1400 drives only the fourth data bus DBUS4 corresponding to the input-output semiconductor die 1400.

Figure 12:
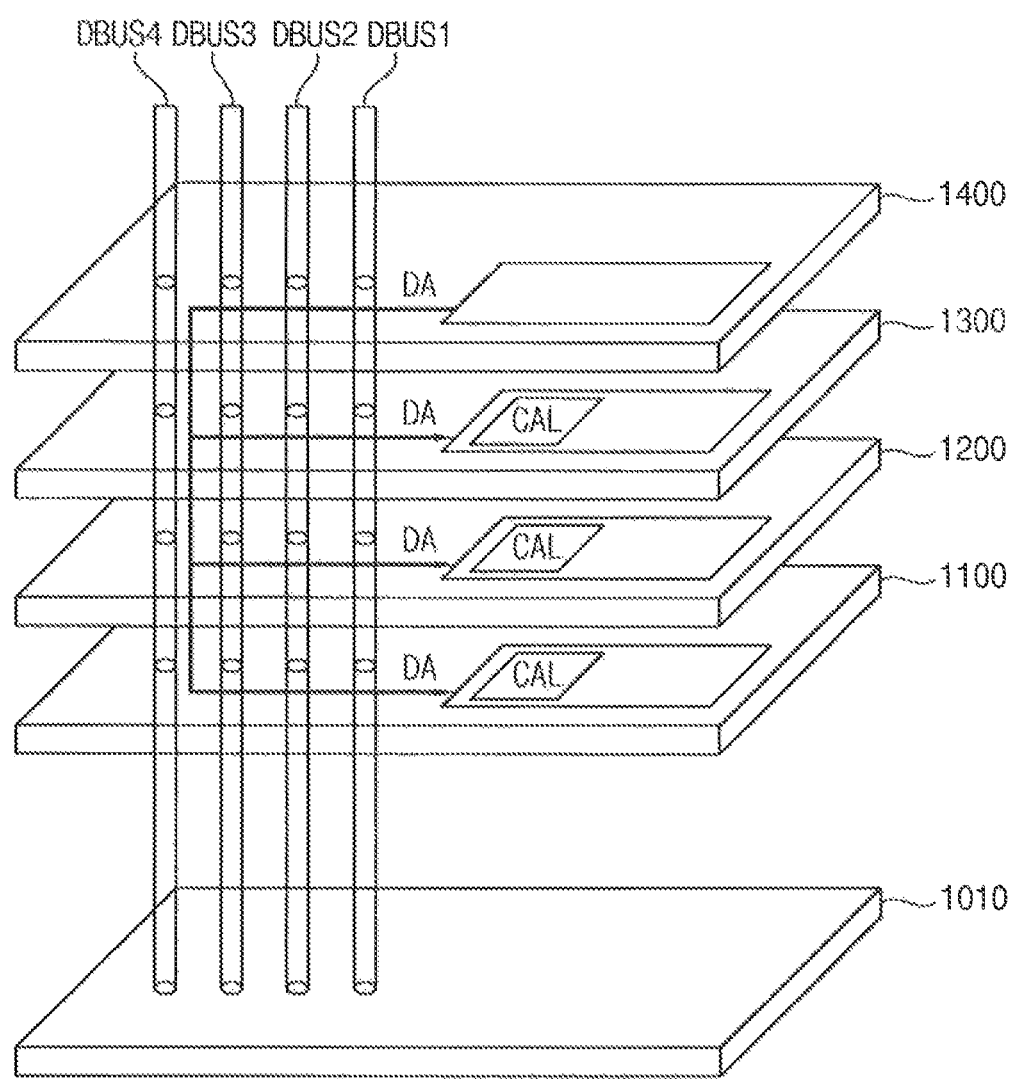
Figure 13:
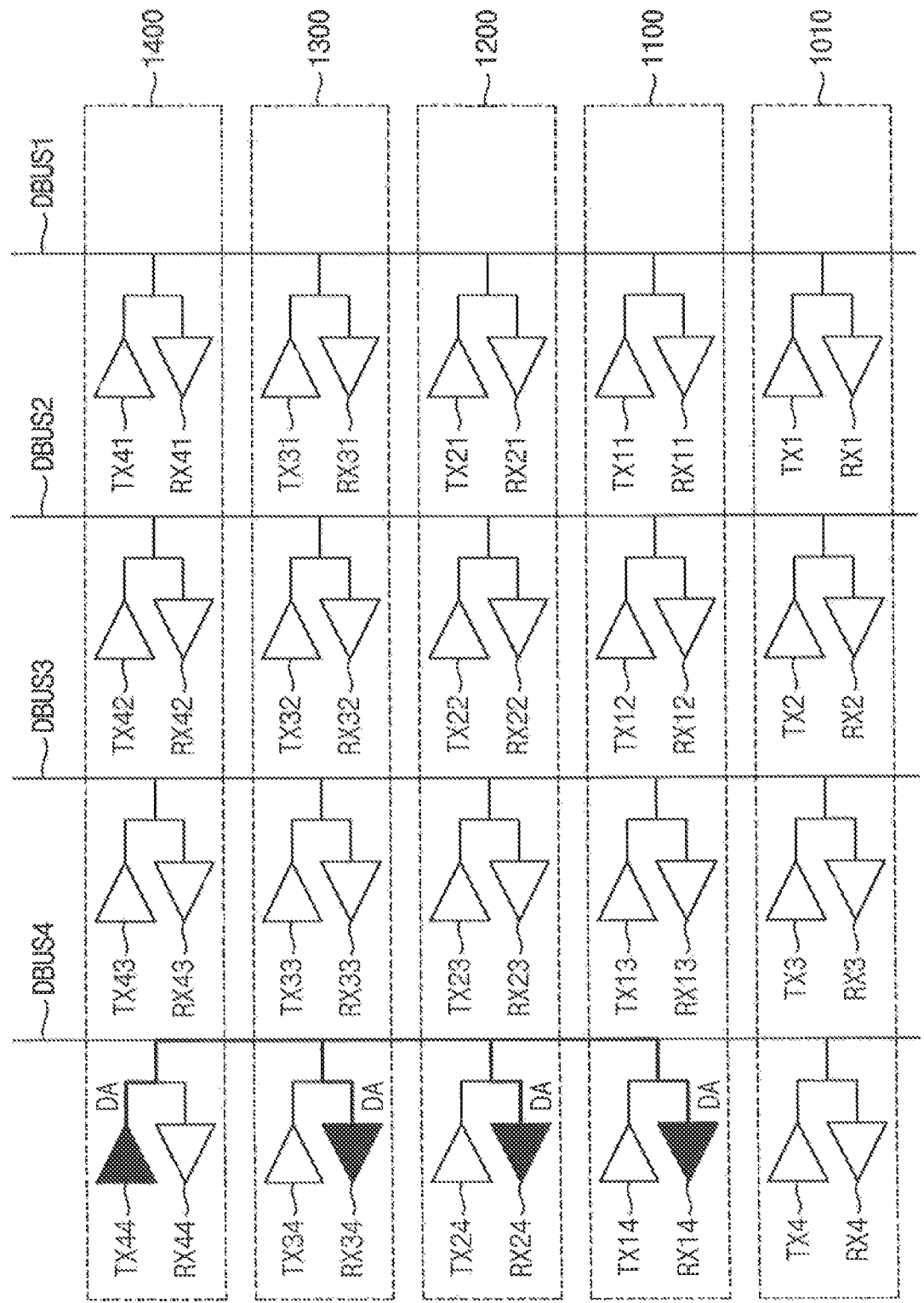

FIG. 12 is a diagram illustrating a data transfer path of broadcast data in a stacked memory device according to an exemplary embodiment of the inventive concept, and FIG. 13 is a diagram illustrating an implementation of the data transfer path of FIG. 12, according to an exemplary embodiment of the inventive concept.

Referring to FIG. 12, the broadcast data DA may be transferred directly from the input-output semiconductor die 1400 to the calculation semiconductor dies 1100, 1200 and 1300 without passing through the logic semiconductor die 1010. The input-output semiconductor die 1400 may drive the fourth data bus DBUS4 corresponding to the input-output semiconductor die 1400 with the broadcast data DA and the calculation semiconductor dies 1100, 1200 and 1300 may receive the broadcast data DA through the fourth data bus DBUS4.

Referring to FIG. 13, a fourth reception circuit RX14 of the first calculation semiconductor die 1100, a fourth reception circuit RX24 of the second calculation semiconductor die 1200 and a fourth reception circuit RX34 of the third calculation semiconductor die 1300 may be simultaneously enabled when a fourth transmission circuit TX44 of the input-output semiconductor die 1400 is enabled such that the broadcast data DA may be simultaneously transferred to all of the calculation semiconductor dies 1100, 1200 and 1300 through the fourth data bus DBUS4.

Figure 14A:
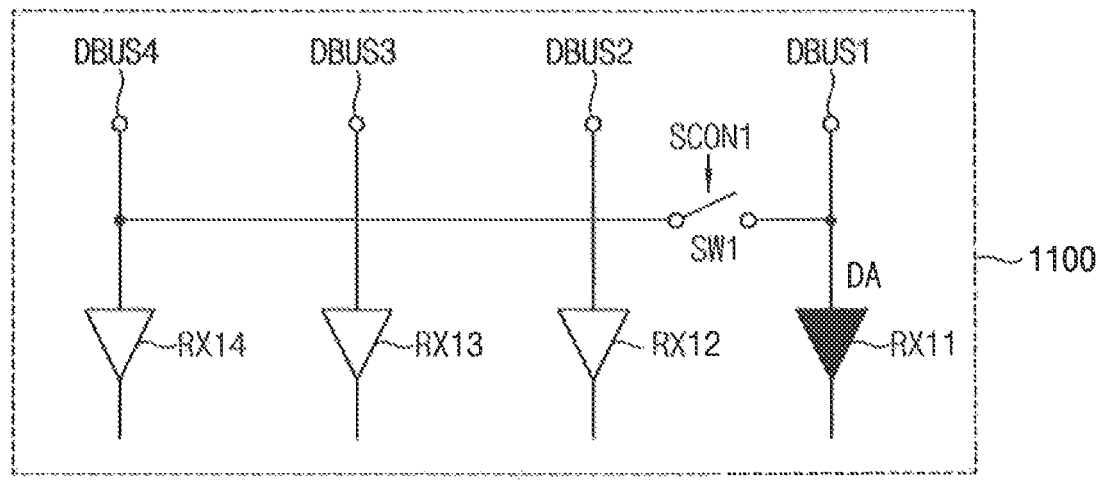
Figure 14B:
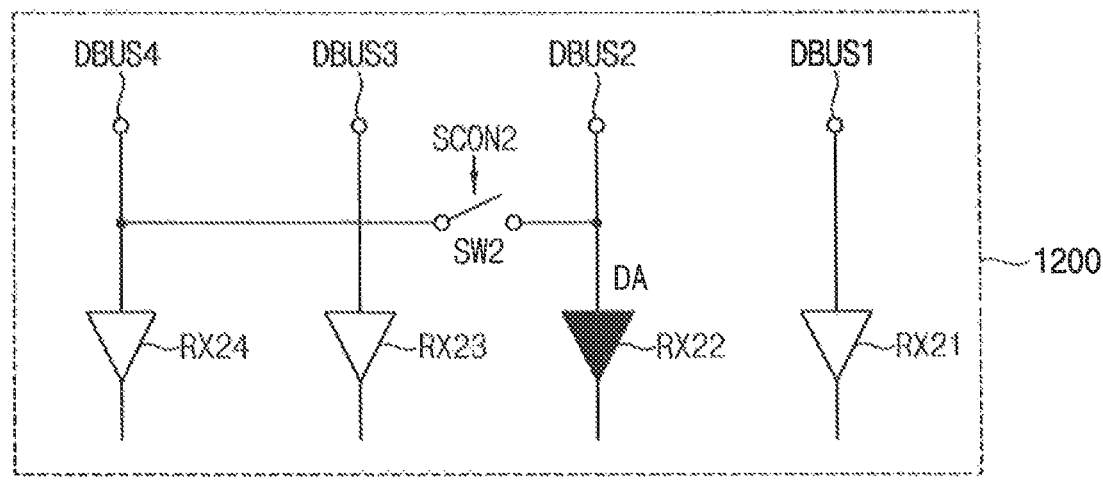
Figure 14C:
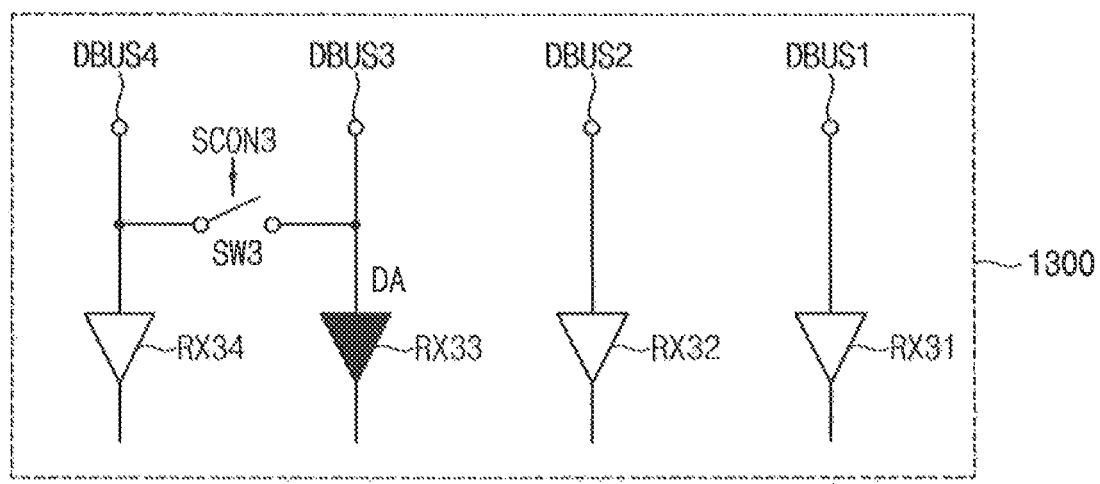

In the embodiment of FIG. 13, the broadcast data DA are transferred by the selective enable of the transmission circuit and the reception circuit. In the embodiments of FIGS. 14A, 14B and 14C, the broadcast data DA may be transferred by selective connection of the data buses.

FIGS. 14A, 14B and 14C are diagrams illustrating implementations of the data transfer path of FIG. 12, according to an exemplary embodiment of the inventive concept.

Referring to FIGS. 14A, 14B and 14C, switch circuits SW1, SW2 and SW3 may be connected between the fourth data bus DBUS4 corresponding to the input-output semiconductor die 1400 and each of the data buses DBUS1, DBUS2 and DBUS3 respectively corresponding to the calculation semiconductor dies 1100, 1200 and 1300. The switch circuits SW1, SW2 and SW3 are turned on in response to switch control signals SCON1, SCON2 and SCON3, respectively. All of the data buses DBUS1~DBUS4 may be electrically connected when all of the switch circuits SW1, SW2 and SW3 are turned on. In this case, the broadcast data DA may be transferred to the calculation semiconductor dies 1100, 1200 and 1300 through the first, second and third data buses DBUS1, DBUS2 and DBUS3 by enabling the reception circuits RX11, RX22 and RX33 respectively corresponding to the first, second and third data buses DBUS1, DBUS2 and DBUS3 in the respective calculation semiconductor dies 1100, 1200 and 1300 even though the input-output semiconductor die 1400 drives only the fourth data bus DBUS4.

In exemplary embodiments of the inventive concept, as will be described below with reference to FIGS. 15 through 18, calculation result data DR1, DR2 and DR3, which are output from the calculation circuits CAL in the calculation semiconductor dies 1100, 1200 and 1300, may be transferred from the calculation semiconductor dies 1100, 1200 and 1300 to the logic semiconductor die 1010, and then, transferred from the logic semiconductor die 1010 to the input-output semiconductor die 1400. In exemplary embodiments of the inventive concept, as will be described below with reference to FIGS. 19 through 22, the calculation result data DR1, DR2 and DR3 may be transferred directly from the calculation semiconductor dies 1100, 1200 and 1300 to the input-output semiconductor die 1400 without passing through the logic semiconductor die 1010.

Figure 15:
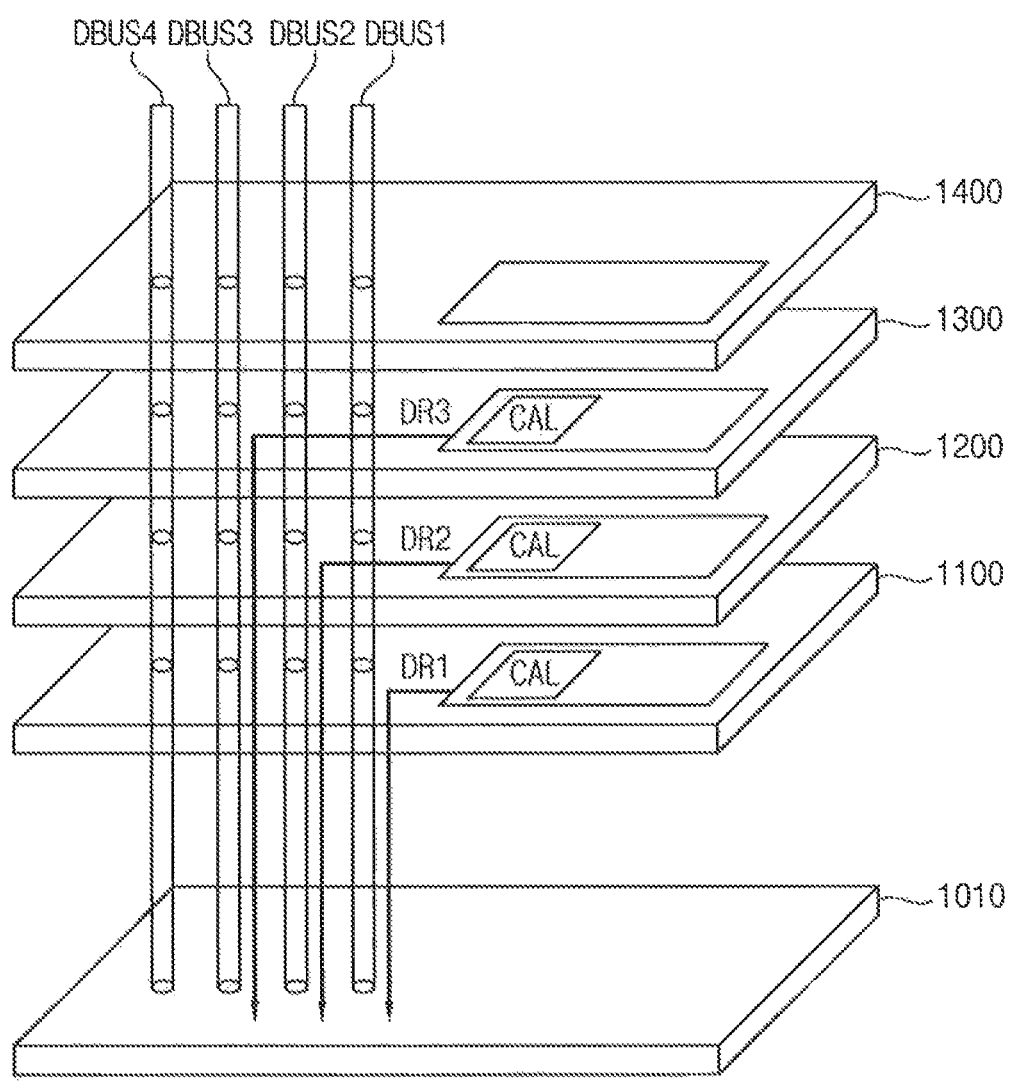
FIGS. 15, 16, 17, 18, 19, 20, 21 and 22 are diagrams illustrating a transfer path of output data of a calculation circuit in a stacked memory device according to exemplary embodiments of the inventive concept.
Figure 16:
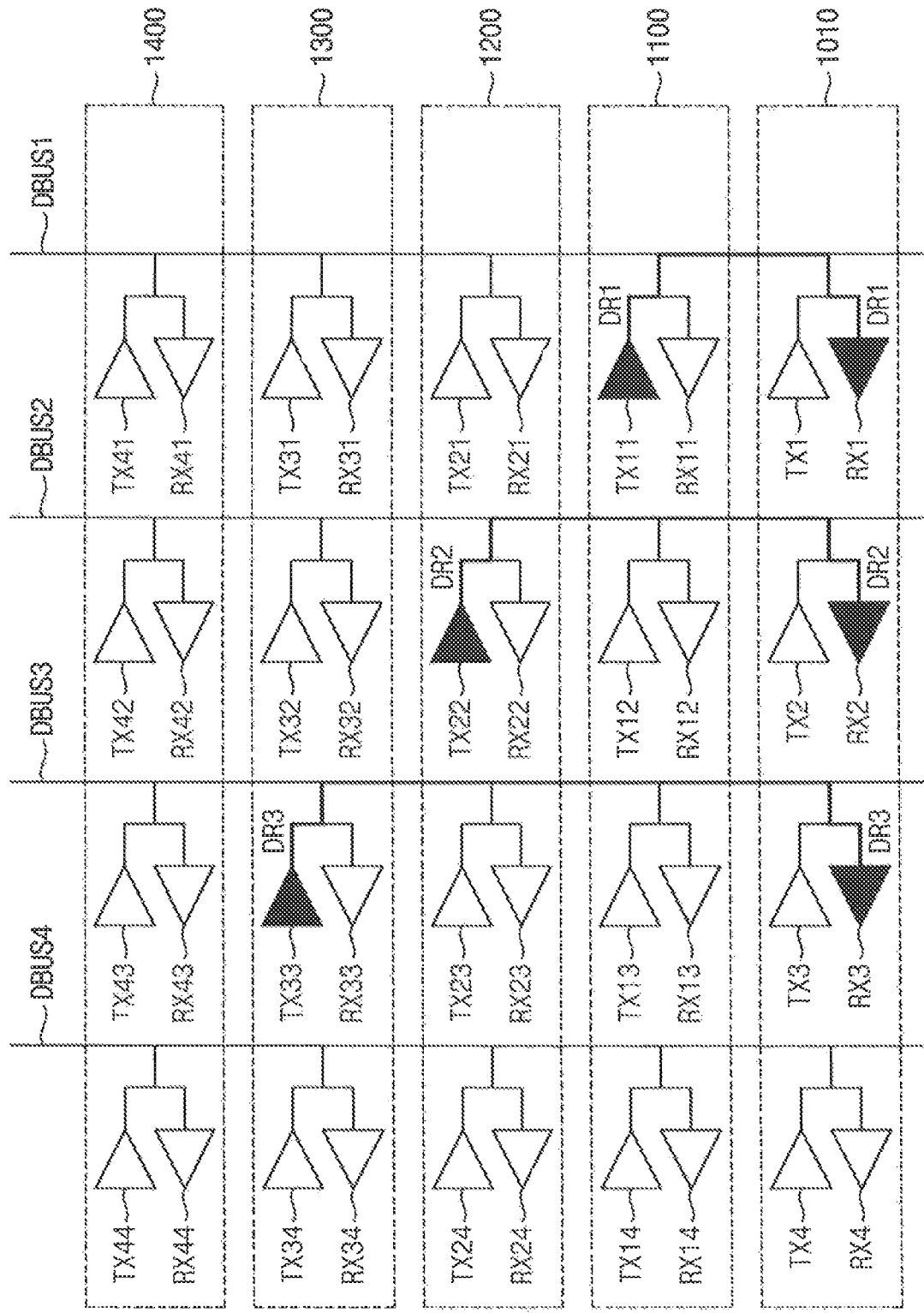

FIG. 15 is a diagram illustrating a first transfer path of output data of calculation circuits in a stacked memory device according to an exemplary embodiment of the inventive concept, and FIG. 16 is a diagram illustrating an implementation of the first transfer path of FIG. 15, according to an exemplary embodiment of the inventive concept.

Referring to FIG. 15, the calculation result data DR1, DR2 and DR3 may be simultaneously transferred from the calculation semiconductor dies 1100, 1200 and 1300 to the logic semiconductor die 1010 through the data buses DBUS1, DBUS2 and DBUS3 respectively corresponding to the calculation semiconductor dies 1100, 1200 and 1300. As described with reference to FIG. 2, the logic semiconductor die 1010 may include a global buffer 1040 and the calculation result data DR1, DR2 and DR3 from the calculation semiconductor dies 1100, 1200 and 1300 may be stored in the global buffer 1040.

Referring to FIG. 16, a first transmission circuit TX11 of the first calculation semiconductor die 1100 and a first reception circuit RX1 of the logic semiconductor die 1010 may be enabled to transfer the calculation result data DR1 through the first data bus DBUS1. A second transmission circuit TX22 of the second calculation semiconductor die 1200 and a second reception circuit RX2 of the logic semiconductor die 1010 may be enabled to transfer the calculation result data DR2 through the second data bus DBUS2. A third transmission circuit TX33 of the third calculation semiconductor die 1300 and a third reception circuit RX3 of the logic semiconductor die 1010 may be enabled to transfer the calculation result data DR3 through the third data bus DBUS3. The transfer of the calculation result data DR1, DR2 and DR3 may be simultaneously performed with respect to all of the calculation semiconductor dies 1100, 1200 and 1300.

Figure 17:
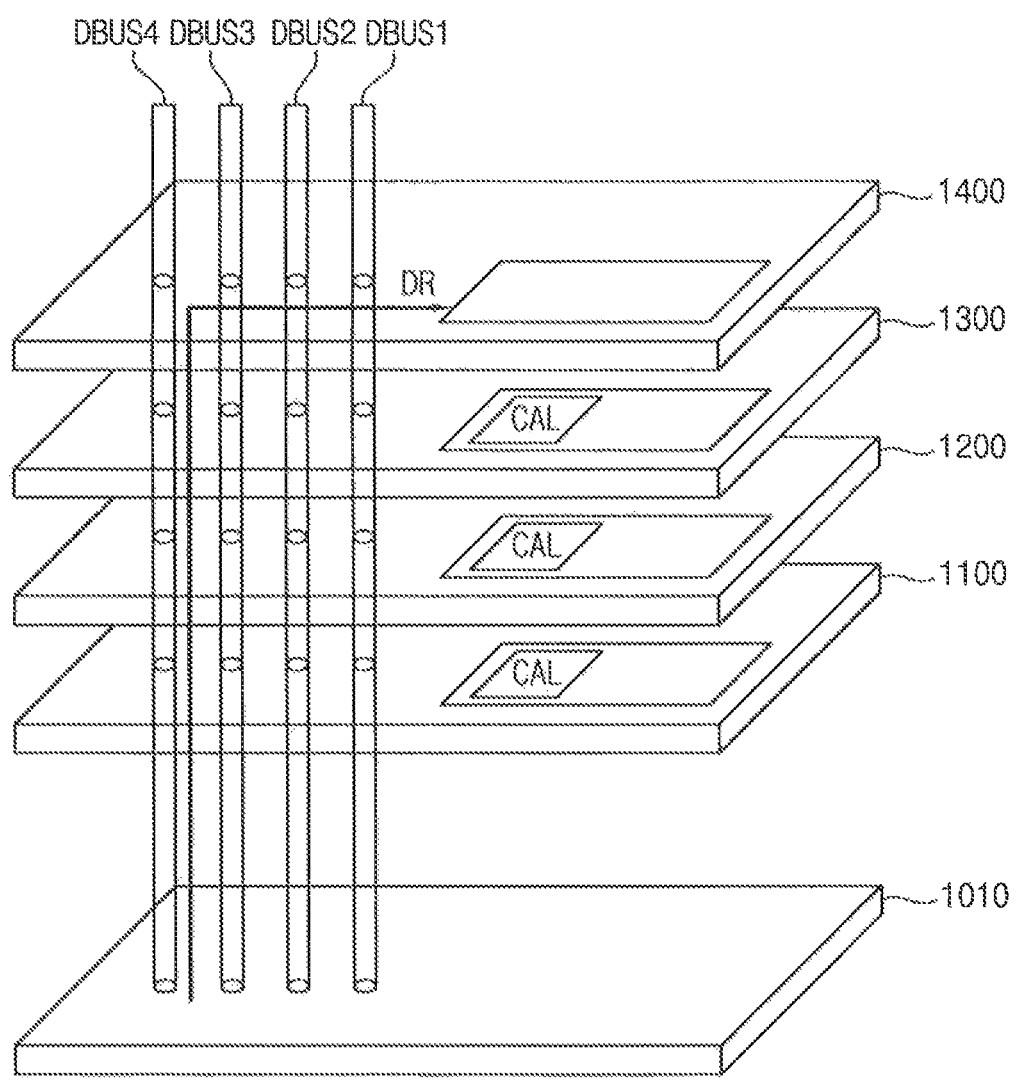
Figure 18:
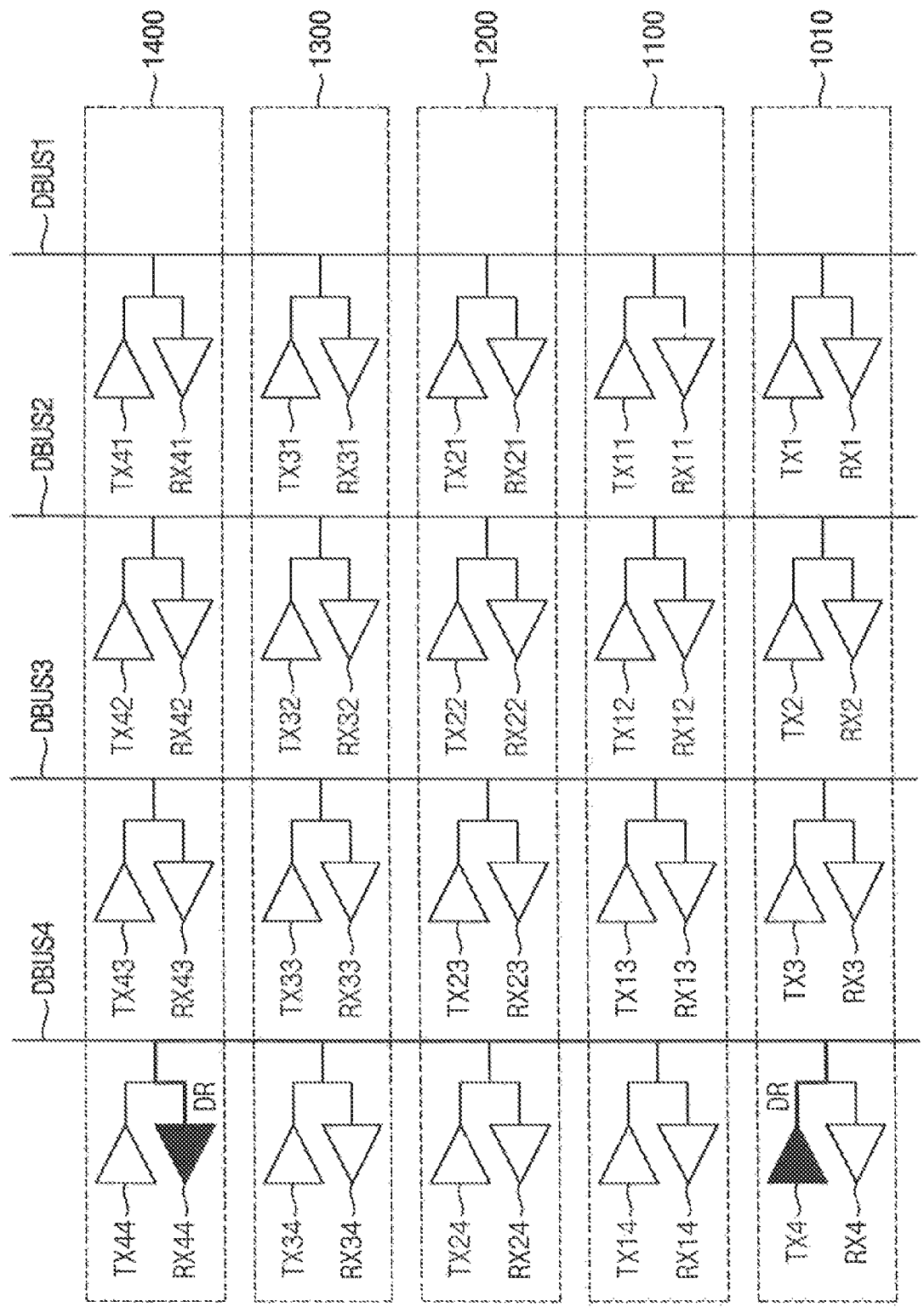

FIG. 17 is a diagram illustrating a second transfer path of output data of calculation circuits in a stacked memory device according to an exemplary embodiment of the inventive concept, and FIG. 18 is a diagram illustrating an implementation of the second transfer path of FIG. 17, according to an exemplary embodiment of inventive concept.

Referring to FIG. 17, calculation result data DR may be sequentially transferred from the logic semiconductor die 1010 to the input-output semiconductor die 1400 by a time-division scheme through the fourth data bus DBUS corresponding to the input-output semiconductor die 1400. The calculation result data DR transferred from the logic semiconductor die 1010 to the input-output semiconductor die 1400 may be the same as the calculation result data DR1, DR2 and DR3 output from the calculation semiconductor dies 1100, 1200 and 1300 or data processed by the data transform logic 1050 in FIG. 2.

Referring to FIG. 18, a fourth transmission circuit TX4 of the logic semiconductor die 1010 and a fourth reception circuit RX44 of the input-output semiconductor die 1400 may be enabled to transfer the calculation result data DR through the fourth data bus DBUS4. In this case, the calculation result data DR may be stored in the memory integrated circuit of the input-output semiconductor die 1400 through the normal write operation. If the amount of the calculation result data DR is too high, the calculation result data may be transferred and stored by a time-division scheme.

Figure 19:
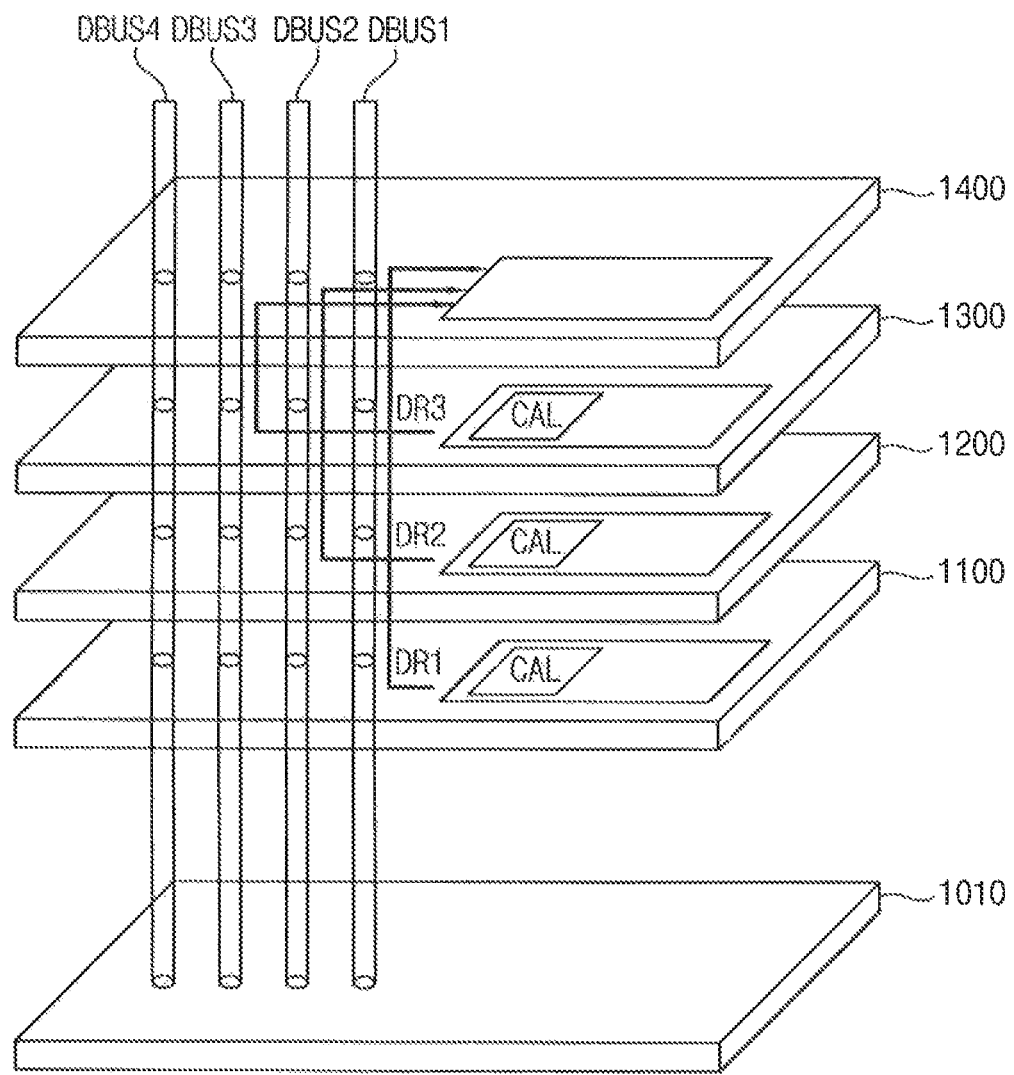
Figure 20:
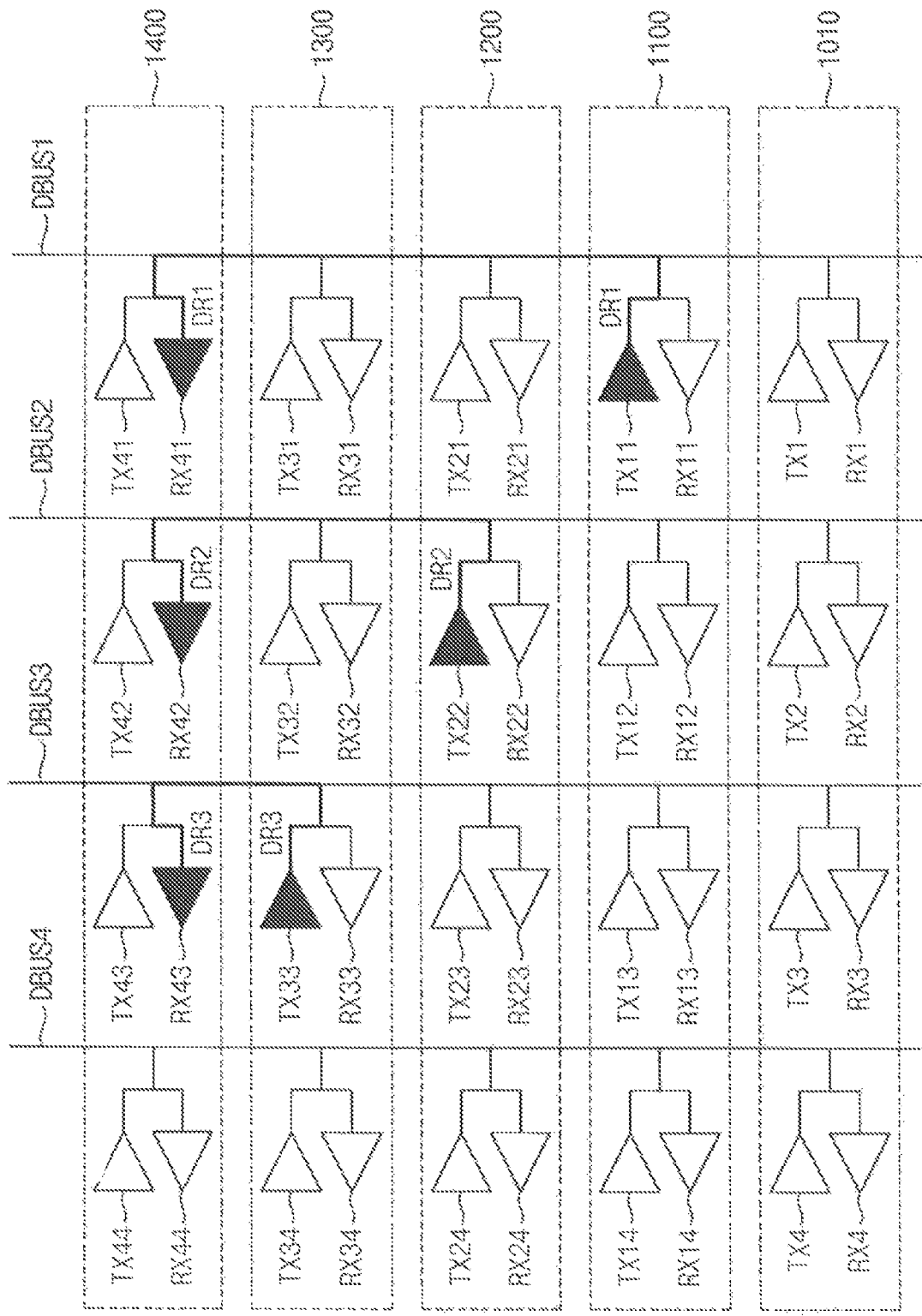

FIG. 19 is a diagram illustrating a transfer path of output data of calculation circuits in a stacked memory device according to an exemplary embodiment of the inventive concept, and FIG. 20 is a diagram illustrating an implementation of the transfer path of FIG. 19, according to an exemplary embodiment of the inventive concept.

Referring to FIG. 19, the calculation result data DR1, DR2 and DR3 may be transferred directly from the calculation semiconductor dies 1100, 1200 and 1300 to the input-output semiconductor die 1400 without passing through the logic semiconductor die 1010. Each of the calculation semiconductor dies 1100, 1200 and 1300 may drive each of the data buses DBUS1, DBUS2 and DBUS3 respectively corresponding to the calculation semiconductor dies 1100, 1200 and 1300 with the calculation result data DR1, DR2 and DR3. The input-output semiconductor die 1400 may sequentially receive the calculation result data DR1, DR2 and DR3 through the data buses DBUS1, DBUS2 and DBUS3 respectively corresponding to the calculation semiconductor dies 1100, 1200 and 1300.

Referring to FIG. 20, a first transmission circuit TX11 of the first calculation semiconductor die 1100 and a first reception circuit RX41 of the input-output semiconductor die 1400 may be enabled to transfer the calculation result data DR1 through the first data bus DBUS1. A second transmission circuit TX22 of the second calculation semiconductor die 1200 and a second reception circuit RX42 of the input-output semiconductor die 1400 may be enabled to transfer the calculation result data DR2 through the second data bus DBUS2. A third transmission circuit TX33 of the third calculation semiconductor die 1300 and a third reception circuit RX43 of the input-output semiconductor die 1400 may be enabled to transfer the calculation result data DR3 through the third data bus DBUS3. The transfer of the calculation result data DR1, DR2 and DR3 may be performed sequentially with respect the calculation Lu semiconductor dies 1100, 1200 and 1300.

Figure 21:
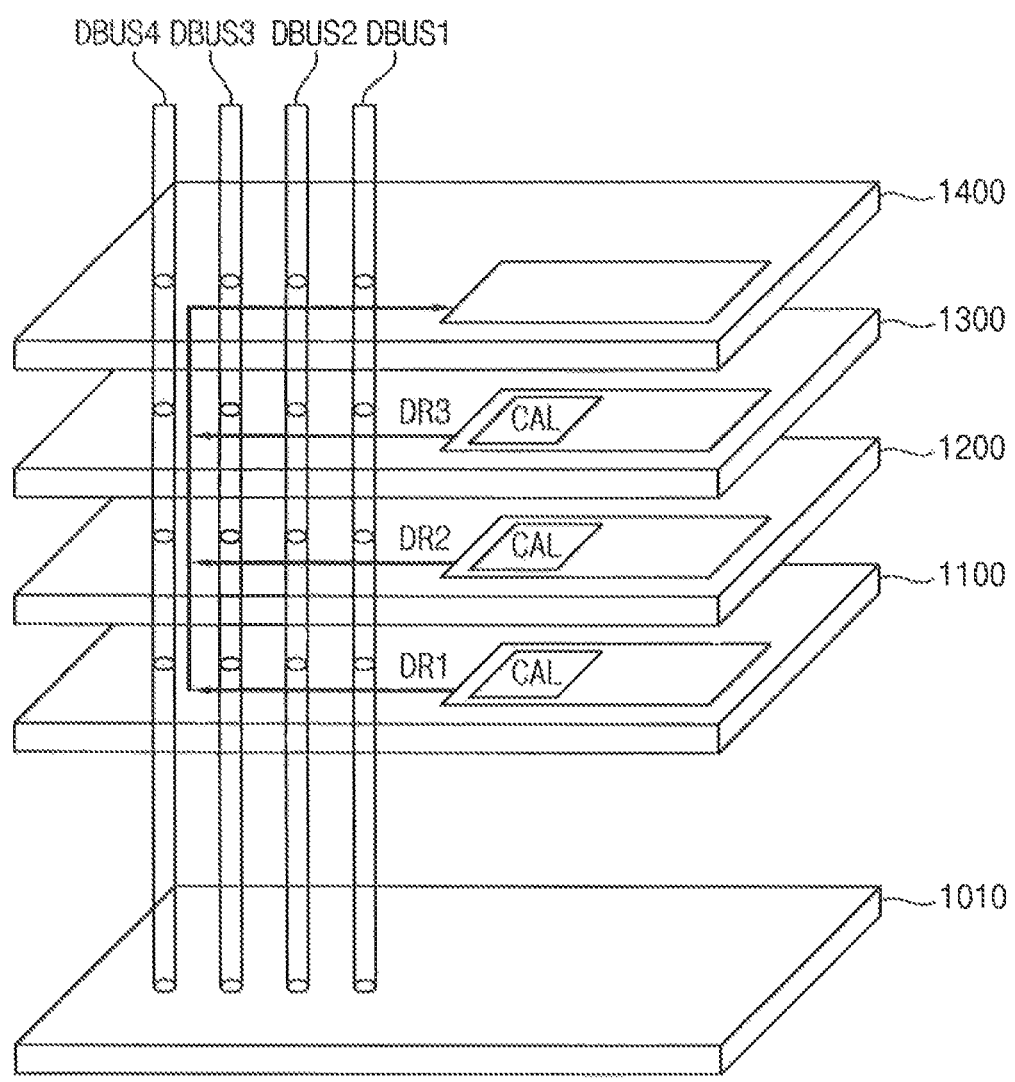
Figure 22:
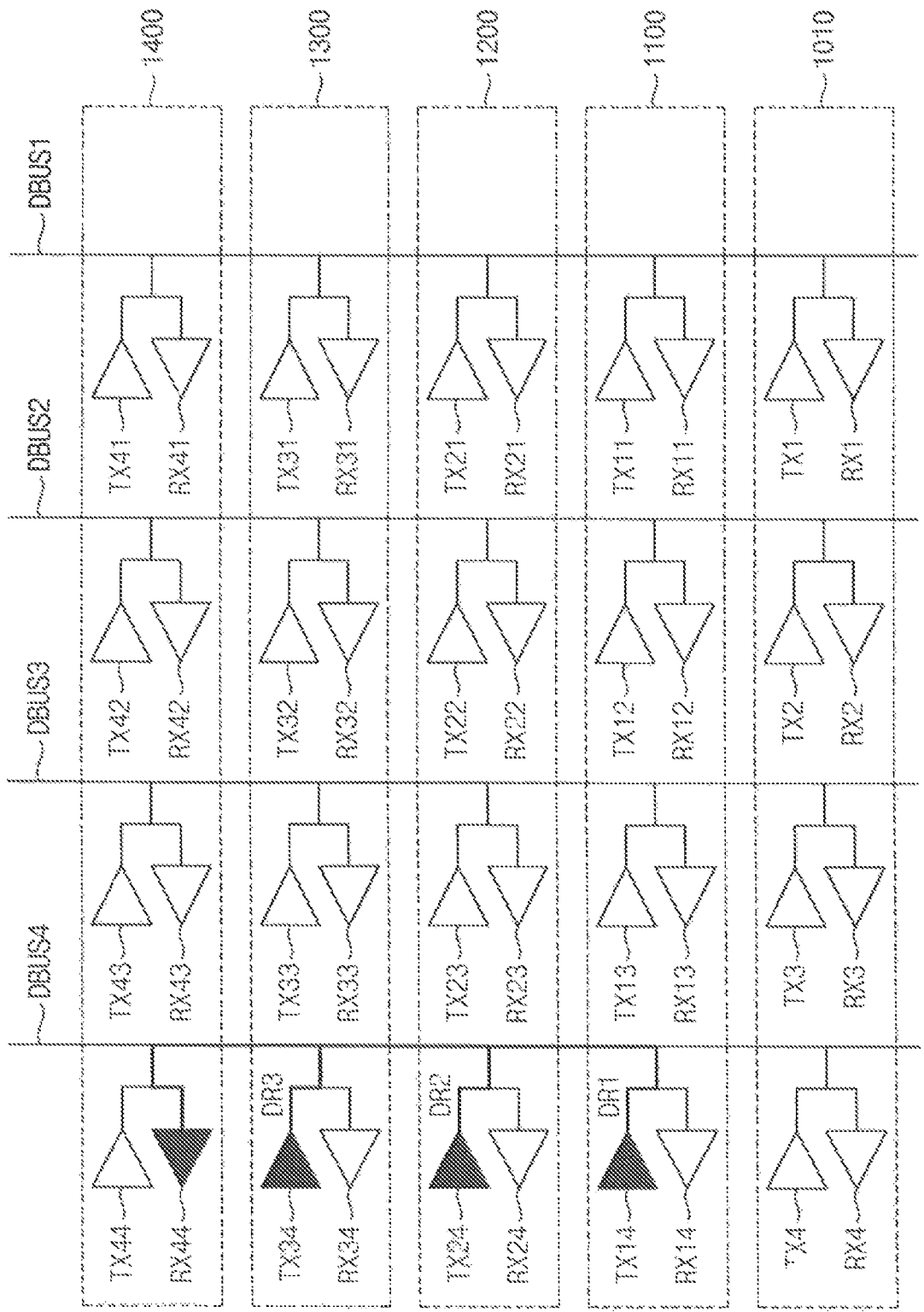

FIG. 21 is a diagram illustrating a transfer path of output data of calculation circuits in a stacked memory device according to an exemplary embodiment of the inventive concept, and FIG. 22 is a diagram illustrating an implementation of the transfer path of FIG. 21, according to an exemplary embodiment of the inventive concept.

Referring to FIG. 21, the calculation result data DR1, DR2 and DR3 may be transferred directly from the calculation semiconductor dies 1100, 1200 and 1300 to the input-output semiconductor die 1400 without passing through the logic semiconductor die 1010. The calculation semiconductor dies 1100, 1200 and 1300 may sequentially drive the fourth data bus DBUS4 corresponding to the input-output semiconductor die 1400 with the calculation result data DR1, DR2 and DR3 and the input-output semiconductor die 1400 may sequentially receive the calculation result data DR1, DR2 and DR3 through the fourth data bus DBUS4 corresponding to the input-output semiconductor die 1400.

Referring to FIG. 22, a fourth transmission circuit TX14 of the first calculation semiconductor die 1100, a fourth transmission circuit TX24 of the second calculation semiconductor die 1200 and a fourth transmission circuit TX34 of the through calculation semiconductor die 1300 may be enabled to sequentially drive the fourth data bus DBUS4 with the calculation result data DR1, DR2 and DR3. The fourth reception circuit RX44 of the input-output semiconductor die 1400 may maintain the enabled state to sequentially receive the calculation result data DR1, DR2 and DR3.

Figure 23:
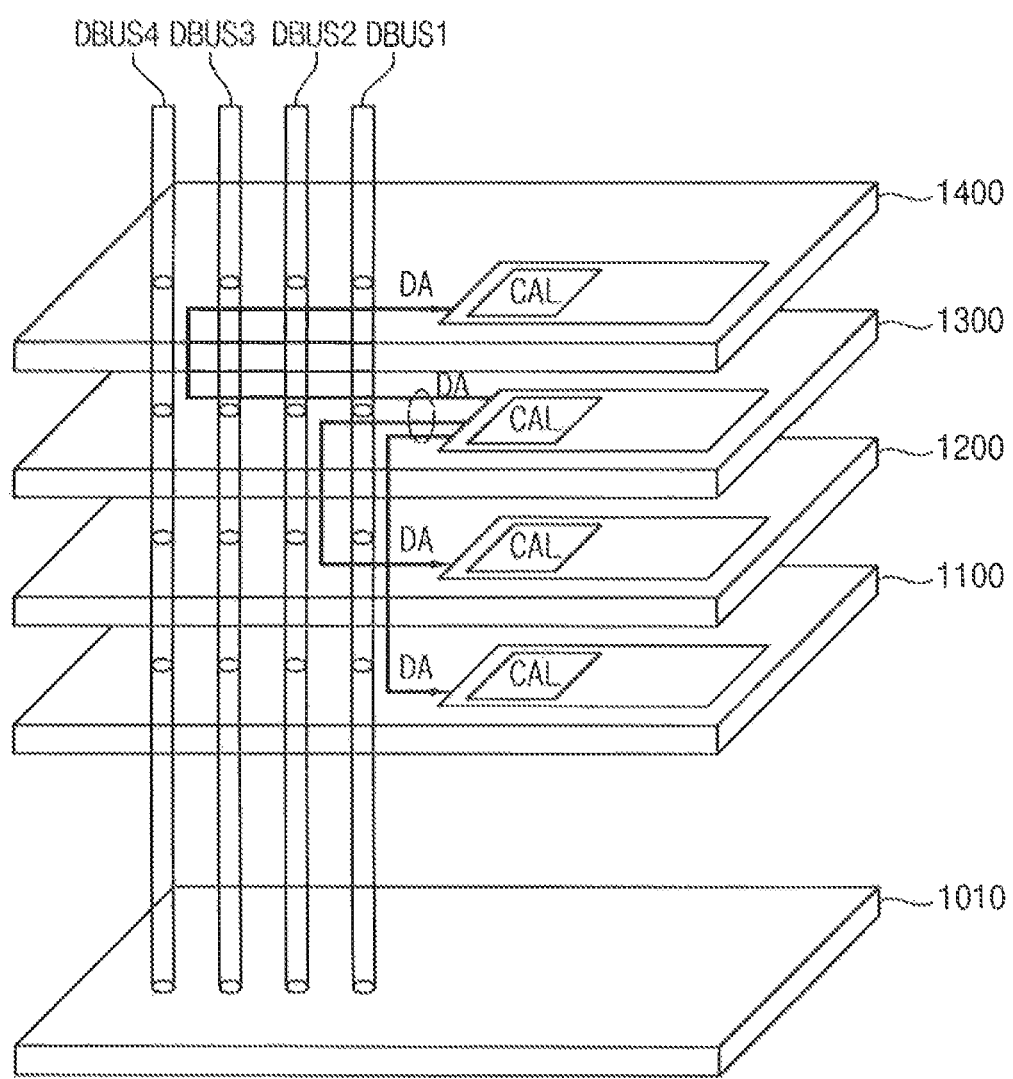
FIGS. 23 and 24 are diagrams illustrating a transfer path of broadcast data in a stacked memory device according to exemplary embodiments of the inventive concept.
Figure 24:
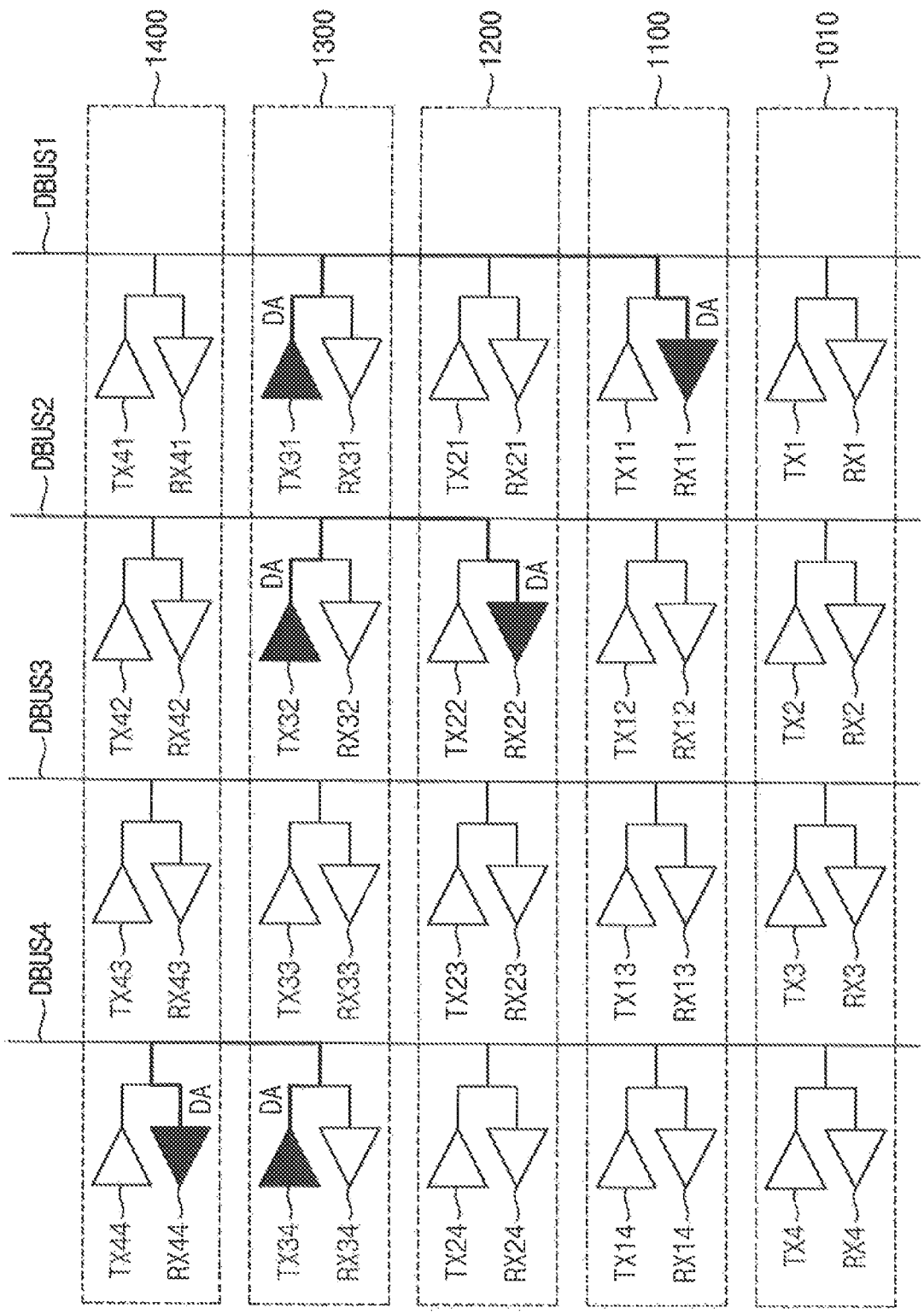

FIG. 23 is a diagram illustrating a data transfer path of broadcast data in a stacked memory device according to an exemplary embodiment of the inventive concept, and FIG. 24 is a diagram illustrating an implementation of the data transfer path of FIG. 23, according to an exemplary embodiment of the inventive concept.

As illustrated in FIG. 23, all of the stacked memory semiconductor dies 1100, 1200, 1300 and 1400 may be the calculation semiconductor die that includes the calculation circuit CAL. In this case, the broadcast data DA may be transferred from one of the calculation semiconductor dies 1100, 1200, 1300 and 1400 to another one of the calculation semiconductor dies. The calculation semiconductor die to provide the broadcast data DA may be determined based on a command provided from the logic semiconductor die 1010. FIG. 23 illustrates a non-limiting example in which the third calculation semiconductor die 1300 provides the broadcast data DA.

Referring to FIG 23, the broadcast data DA may be transferred directly from one calculation semiconductor die, in other words, the third calculation semiconductor die 1300 to the other calculation semiconductor dies, in other words, the first, second and fourth calculation semiconductor dies 1100, 1200 and 1400 without passing through the logic semiconductor die 1010. The third calculation semiconductor die 1300 may simultaneously drive the first, second and fourth data buses DBUS1, DBUS2 and DBUS4 respectively corresponding to the first, second and fourth memory semiconductor dies 1100, 1200 and 1400 with the broadcast data DA. The first, second and fourth calculation semiconductor dies 1100, 1200 and 1400 may receive the broadcast data DA through the data buses DBUS1, DBUS2 and DBUS4.

Referring to FIG. 24, a first transmission circuit TX31 of the third calculation semiconductor die 1300 and a first reception circuit RX11 of the first calculation semiconductor die 1100 may be enabled to transfer the broadcast data DA through the first data bus DBUS1. A second transmission circuit TX32 of the third calculation semiconductor die 1300 and a second reception circuit RX22 of the second calculation semiconductor die 1200 may be enabled to transfer the broadcast data DA through the second data bus DBUS2. A fourth transmission circuit TX34 of the third calculation semiconductor die 1300 and a fourth reception circuit RX44 of the fourth calculation semiconductor die 1400 may be enabled to transfer the broadcast data DA through the fourth data bus DBUS4. The transfer of the broadcast data DA may be performed simultaneously with respect to all of the other calculation semiconductor dies 1100, 1200 and 1400. It is to be understood that the third transmission circuit TX33 of the third calculation semiconductor die 1300 and the third reception circuit RX33 of the third calculation semiconductor die 1300 may be enabled to transfer the broadcast data DA to the input terminals of the calculation units of the third calculation semiconductor die 1300. In this case, the third calculation semiconductor die 1300 may perform the calculations like the other calculation semiconductor dies 1100, 1200 and 1400 in addition to performing the function of providing the broadcast data DA to the other calculation semiconductor dies 1100, 1200 and 1400.

Figure 25:
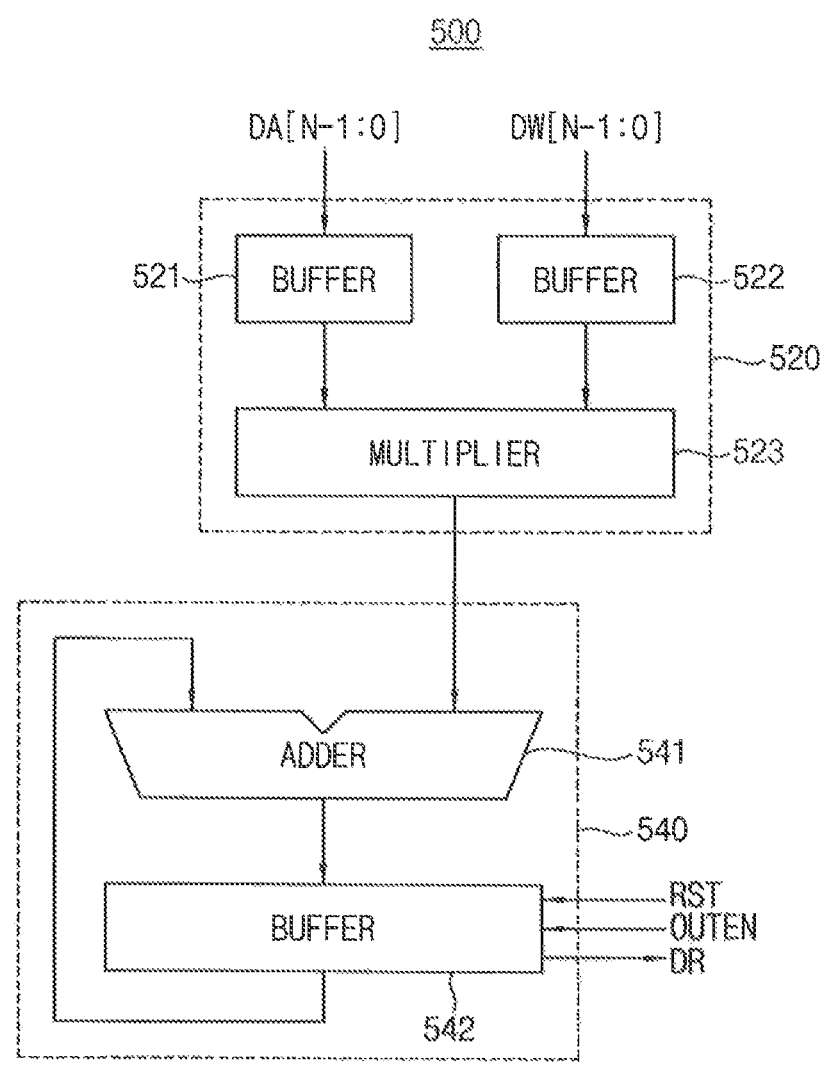
FIG. 25 is a diagram illustrating a calculation unit included in a stacked memory device according to an exemplary embodiment of the inventive concept.

FIG. 25 is a diagram illustrating a calculation unit included in a stacked memory device according to an exemplary embodiment of the inventive concept.

Referring to FIG. 25, each calculation unit 500 may include a multiplication circuit 520 and an accumulation circuit 540. The multiplication circuit 520 may include buffers 521 and 522 and a multiplier 523 configured to multiply the broadcast data DA[N-1:0] and the internal data DW[N-1:0]. The accumulation circuit 540 may include an adder 541 and a buffer 542 to accumulate outputs of the multiplication circuit 520 to provide the calculation result data DR. The accumulation circuit 540 may be initialized in response to a reset signal RST and output the calculation result data DR in response to an output enable signal OUTEN. Using the calculation units as illustrated in FIG. 25, a matrix calculation may be performed efficiently as will be described with reference to FIG. 27.

Figure 26:
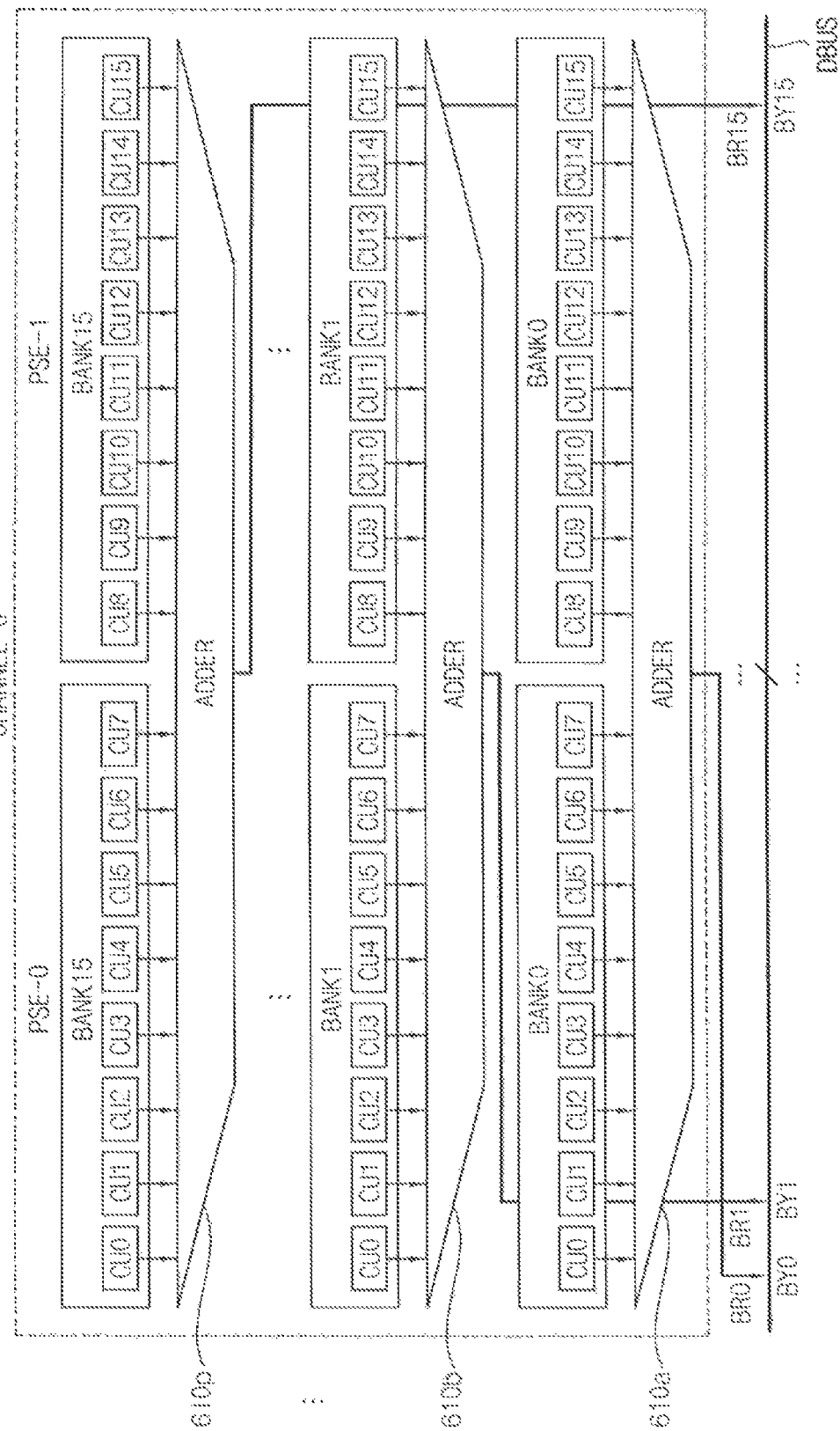
FIG. 26 is a diagram illustrating outputting calculation result data, according to an exemplary embodiment of the inventive concept.

FIG. 26 is a diagram illustrating outputting calculation result data, according to an exemplary embodiment of the inventive concept.

FIG. 26 illustrates outputting the calculation result data corresponding to one channel CHANNEL-0. The one channel CHANNEL-0 may include a plurality of memory banks BANK0~BANK15, and each of the memory banks BANK0~BANK15 may include a plurality of calculation units CU0~CU15. The memory banks BANK0~BANK15 may be divided by two pseudo-channels PSE-0 and PSE-1.

Each of the calculation semiconductor dies may further include a plurality of bank adders 610a~610p. Each of the bank adders 610a~610p may sum outputs of the calculation units CU0~CU15 in each of the memory banks BANK0~BANK15 to generate each of bank result signals BR0~BR15. The bank result signals BR0~BR15 may be simultaneously output through the data bus DBUS corresponding to each calculation semiconductor die. For example, if the data bus corresponding to the one calculation semiconductor die has a data width of 128 bits and the one channel CHANNEL-0 includes sixteen memory banks BANK0~BANK15, the output of each bank adder may be output through data paths of 8 bits or one byte of the data bus DBUS. In other words, the bank result signal BR0 of the first bank adder 610a may be output through the data paths corresponding to the first byte BY0 of the data bus DBUS, the bank result signal BR1 of the second bank adder 610b may be output through the data paths corresponding to the second byte BY1 of the data bus DBUS, and in this way, the bank result signal BR15 of the sixteenth bank adder 610p may be output through data paths corresponding to the sixteenth byte BY15 of the data bus DBUS.

Figure 27:
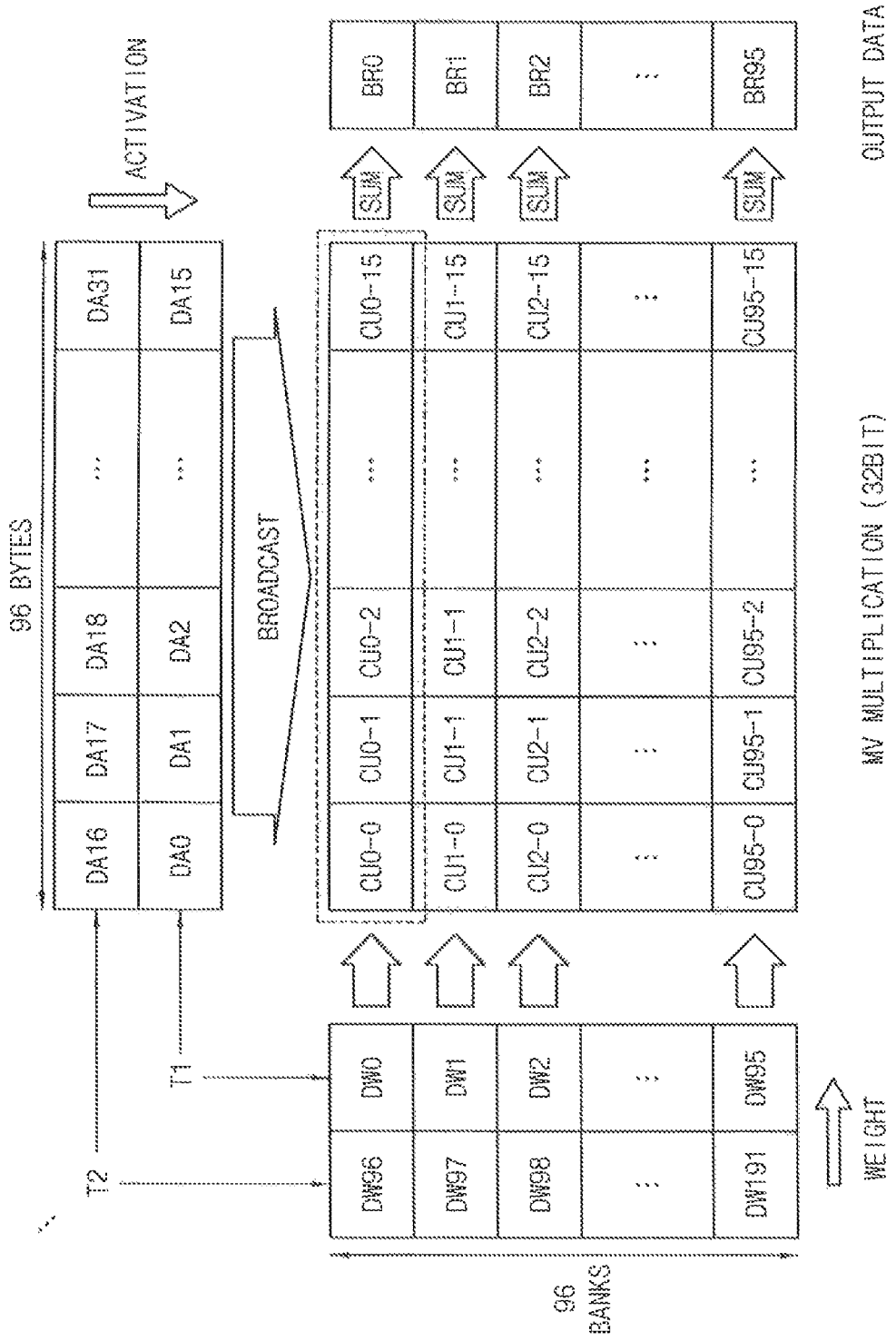
FIG. 27 is a diagram illustrating a matrix calculation using a calculation circuit according to an exemplary embodiment of the inventive concept.

FIG. 27 is a diagram illustrating a matrix calculation using a calculation circuit according to an exemplary embodiment of the inventive concept.

FIG. 27 illustrates a matrix-vector multiplication that is performed using calculation units CU0-0 through CU95-15 in a stacked memory device according to an exemplary embodiment of the inventive concept. In FIG. 27, the calculation units Cui-0 through Cui-15 of the i-th row (i=1~95) correspond to the i-th memory bank BANKi. For example, the matrix-vector multiplication may be a 32-bit mode and each memory bank may include sixteen calculation units. It is assumed that each of the four memory semiconductor dies includes two channels and each channel includes sixteen memory banks. In this case, if one memory semiconductor die is used as the above-described input-output semiconductor die and the other three memory semiconductor dies are used as the above-described calculation semiconductor dies, the number of the memory banks included in the calculation semiconductor dies may be 96, in other words, 6 channels*16 memory banks.

A first set of broadcast data DA0~DA15 during a first period T1 and a second set of broadcast data DA16~DA31 are sequentially provided to all calculation units in all memory banks. As such, activations may be sequentially broadcast. In addition, a first set of internal data DW0~DW95 during the first period T1 and a second set of internal data DW96~DW191 as weights are sequentially provided to the calculation units. The internal data correspond to data read from respective memory banks. As such, the calculation units may perform dot product operations based on the activations and the weights that are sequentially provided. The calculation units in the same memory bank provide partial sums of the same output activation. Accordingly, after the dot product operations are completed, the partial sums may be summed again by the bank adders in FIG. 26 to provide the final result as bank result signals BR0~BR95.

The matrix-vector multiplication as illustrated in FIG. 27 may correspond to a 1*1 convolution or a fully-connected layer. In the case of multilayer perceptron (MLP) and recurrent neural network (RNN), the broadcast data or the broadcast activations correspond to a sub-array of one-dimensional input activation. In the case of convolution neural network (CNN), the input activation corresponds to 1*1 sub-column of input activation tensor.

Figure 28:
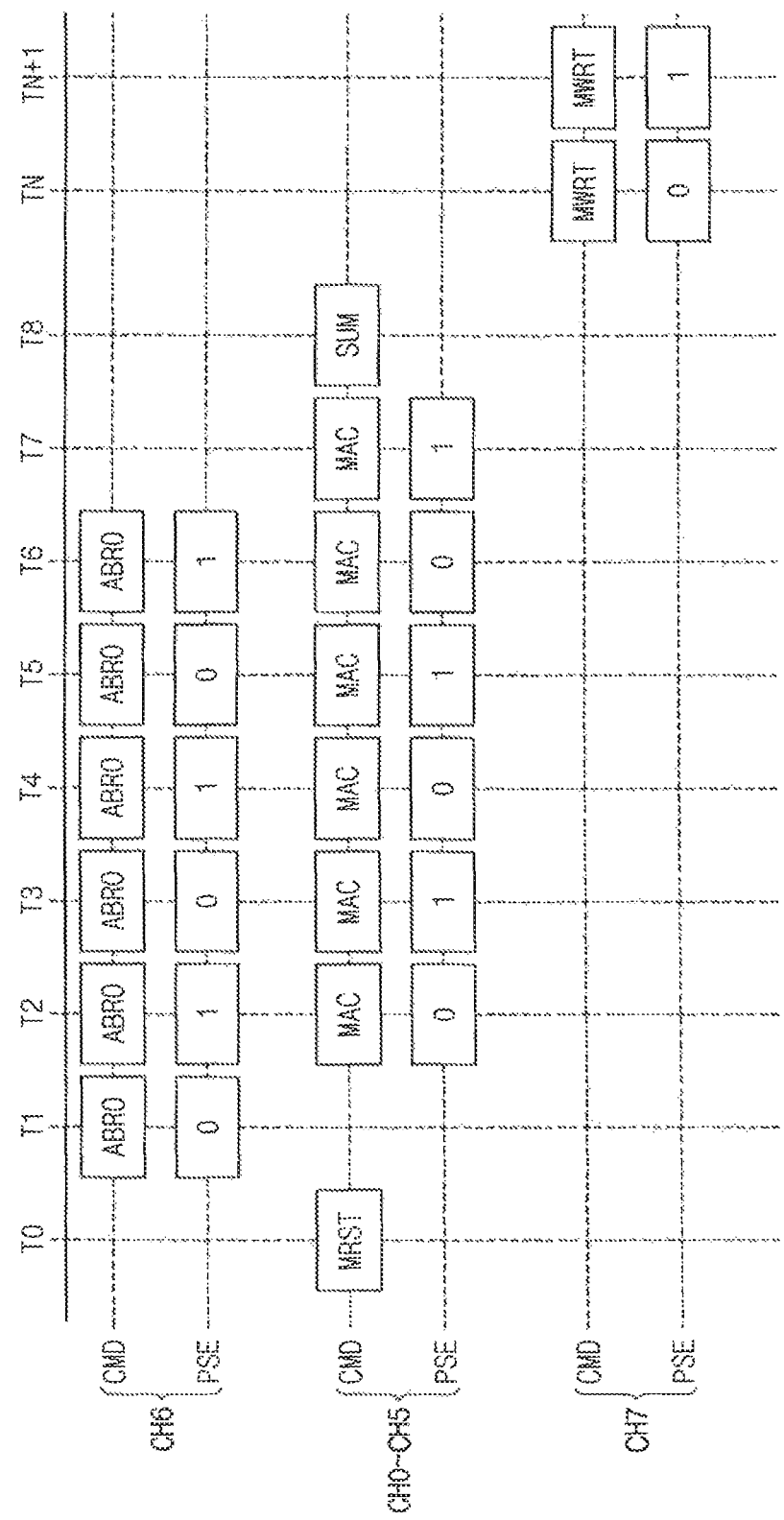
FIG. 28 is a timing diagram illustrating an operation of a stacked memory device according to an exemplary embodiment of the inventive concept.

FIG. 28 is a timing diagram illustrating an operation of a stacked memory device according to an exemplary embodiment of the inventive concept.

As described with reference to FIG. 9, in the stacked memory device according to an exemplary embodiment of the inventive concept, the first, second and third memory semiconductor dies 1100, 1200 and 1300 may correspond to the first, second and third calculation semiconductor dies in which the calculation units CAL are formed and the fourth memory semiconductor die 1400 may correspond to the input-output semiconductor die that does not include the calculation units CAL. In this case, the broadcast data may be provided from the input-output semiconductor die 1400. As specified in the HBM standards, the first calculation semiconductor die 1100 may include a first channel CH0 and a second channel CH1, the second calculation semiconductor die 1200 may include a third channel CH2 and a fourth channel CH3, the third calculation semiconductor die 1300 may include a fifth channel CH4 and a sixth channel CH5, and the input-output semiconductor die 1400 may include a seventh channel CH6 and a eighth channel CH7. Each channel may operate as pseudo-channel 0 or 1.

Commands such as MRST, ABR0, MAC, SUM, MWRT, etc. as illustrated in FIG. 28 may be specified to perform calculations in parallel using the calculation units in the stacked memory device according to exemplary embodiments of the inventive concept. In FIG. 28, time points T0~TN+1 indicate relative timings of the commands.

MRST may be a command to reset buffers in the calculation units. For example, the reset signal RST in FIG. 25 may be activated based on MRST to reset the buffer 542. In addition, MRST may be used to set a channel selector in the control circuit 1030 in FIG. 2 for transfer of the broadcast data.

ABR0 may initiate the transfer of the broadcast data. ABR0 may be similar to the read command but the read data may be transferred to the calculation units in the calculation semiconductor dies, rather than to an external device. ABR0 may be issued per pseudo-channel.

MAC may initiate the calculation operation in the calculation semiconductor dies. MAC may be similar to the read command but the internal data may be transferred to the calculation units, while transfers to the external device or the other semiconductor dies through the through-silicon vias are prevented. MAC may be broadcast to all of the calculation semiconductor dies and issued per pseudo-channel.

SUM may transfer the calculation result data from the calculation units to the logic semiconductor die. For example, the output enable signal OUTEN in FIG. 25 may be activated based on SUM and the calculation result data DR may be summed by the bank adders 610a~610p in FIG. 26 to provide the bank result data BR to the logic semiconductor die 1010.

MWRT may set a channel selector in the control circuit 1030 in FIG. 2 such that the calculation result data may be transferred from the logic semiconductor die 1010 to the input-output semiconductor die.

In FIG. 28, the seventh channel CH6 and the eighth channel CH7 may correspond to the input-output semiconductor die 1400 that stores the broadcast data and the calculation result data, and the first through sixth channels CH0~CH5 may correspond to the calculation semiconductor dies 1100, 1200 and 1300 that store the internal data and perform the calculation operation. As illustrated in FIG. 28, AER0, MAC and MWRT may be issued alternately for the first pseudo-channel PSE-0 and the second pseudo-channel PSE-1, and thus, the operations of the calculation units may performed alternately by a unit of pseudo-channel. For example, at time point T2, the transfer of the broadcast data for the second pseudo-channel PSE-1, and the transfer of the internal data and the calculations for the first channel PSE-0 may be performed simultaneously.

Figure 29:
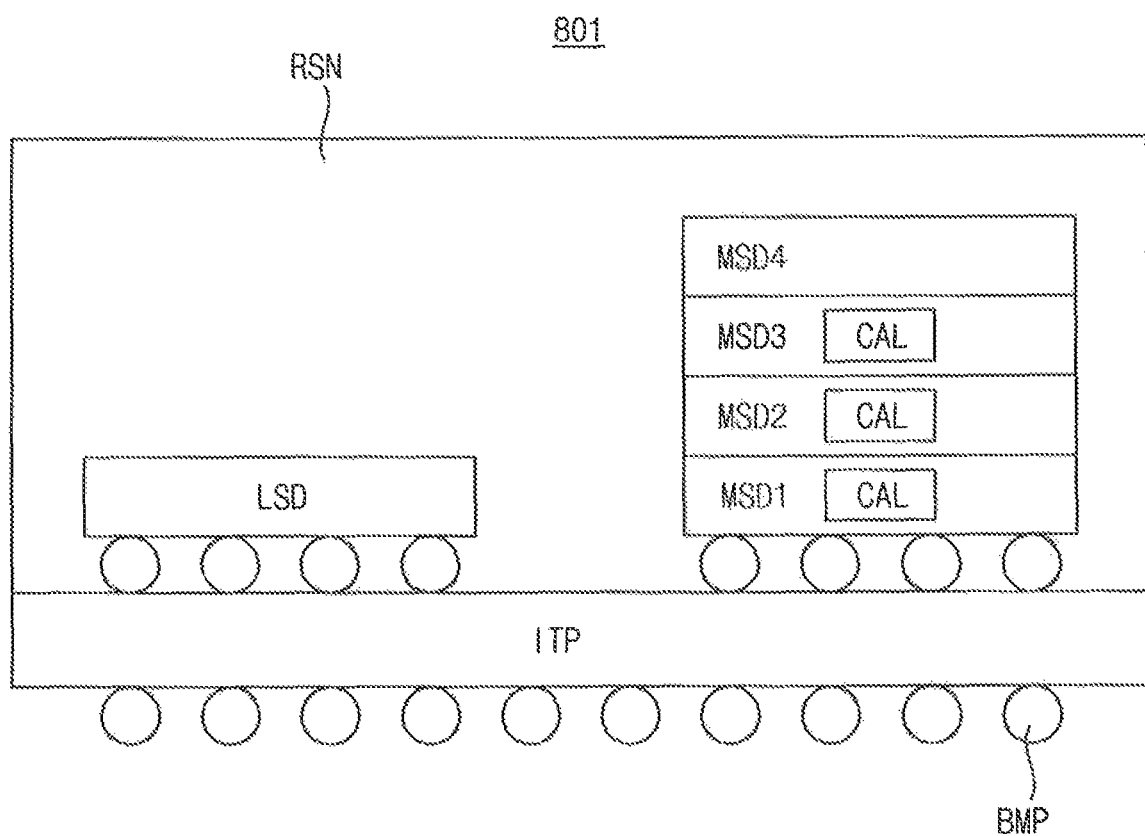
FIGS. 29 and 30 are diagrams illustrating packaging structures of a stacked memory device according to exemplary embodiments of the inventive concept.
Figure 30:
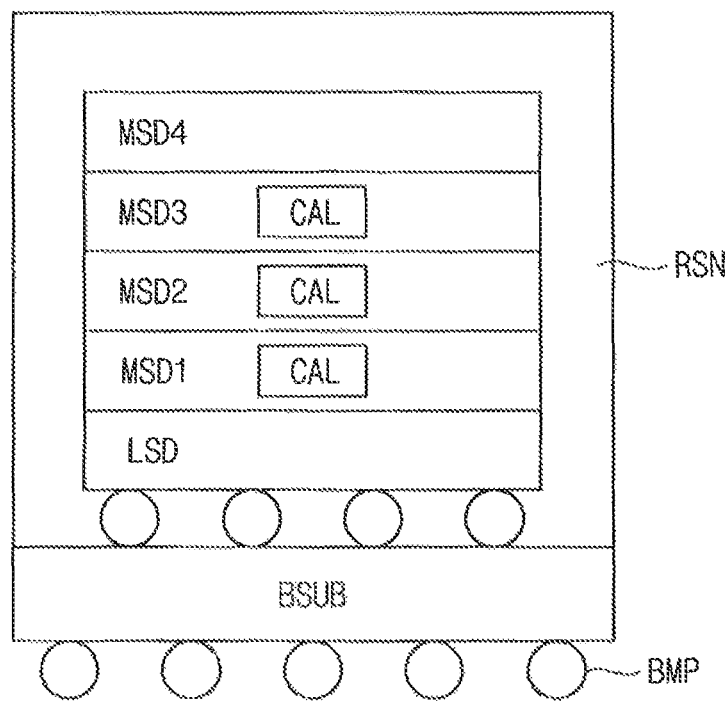

FIGS. 29 and 30 are diagrams illustrating packaging structures of a stacked memory device according to exemplary embodiments of the inventive concept.

Referring to FIG. 29, a memory chip 801 may include an interposer ITP and a stacked memory device stacked on the interposer ITP. The stacked memory device may include a logic semiconductor die LSD and a plurality of memory semiconductor dies MSD1~MSD4.

Referring to FIG. 30, a memory chip 802 may include a base substrate BSUB and a stacked memory device stacked on the base substrate BSUB. The stacked memory device may include a logic semiconductor die LSD and a plurality of memory semiconductor dies MSD1~MSD4.

FIG. 29 illustrates a structure in which the memory semiconductor dies MSD1~MSD4 except for the logic semiconductor die LSD are stacked vertically and the logic semiconductor die LSD is electrically connected to the memory semiconductor dies MSD1~MSD4 through the interposer ITP or the base substrate. FIG. 30 illustrates a structure in which the logic semiconductor die LSD is stacked vertically with the memory semiconductor dies MSD1~MSD4.

As described above, at least one of the memory semiconductor dies MSD1~MSD4 may be the calculation semiconductor die including the calculation circuit CAL. The calculation circuits CAL may include a plurality of calculation units that perform the calculations based on the above-described common broadcast data and respective internal data.

The base substrate BSUB may be the same as the interposer ITP or include the interposer ITP. The base substrate BSUB may be a printed circuit board (PCB). External connecting elements such as conductive bumps BMP may be formed on a lower surface of the base substrate BSUB and internal connecting elements such as conductive bumps may be formed on an upper surface of the base substrate BSUB. In the embodiment of FIG. 30, the logic semiconductor die LSD and the memory semiconductor dies MSD1~MSD4 may be electrically connected through through-silicon vias. In FIG. 29, the memory semiconductor dies MSD1~MSD4 may be electrically connected through through-silicon vias. The stacked semiconductor dies LSD and MSD1~MSD4 may be packaged using resin RSN.

Figure 31:
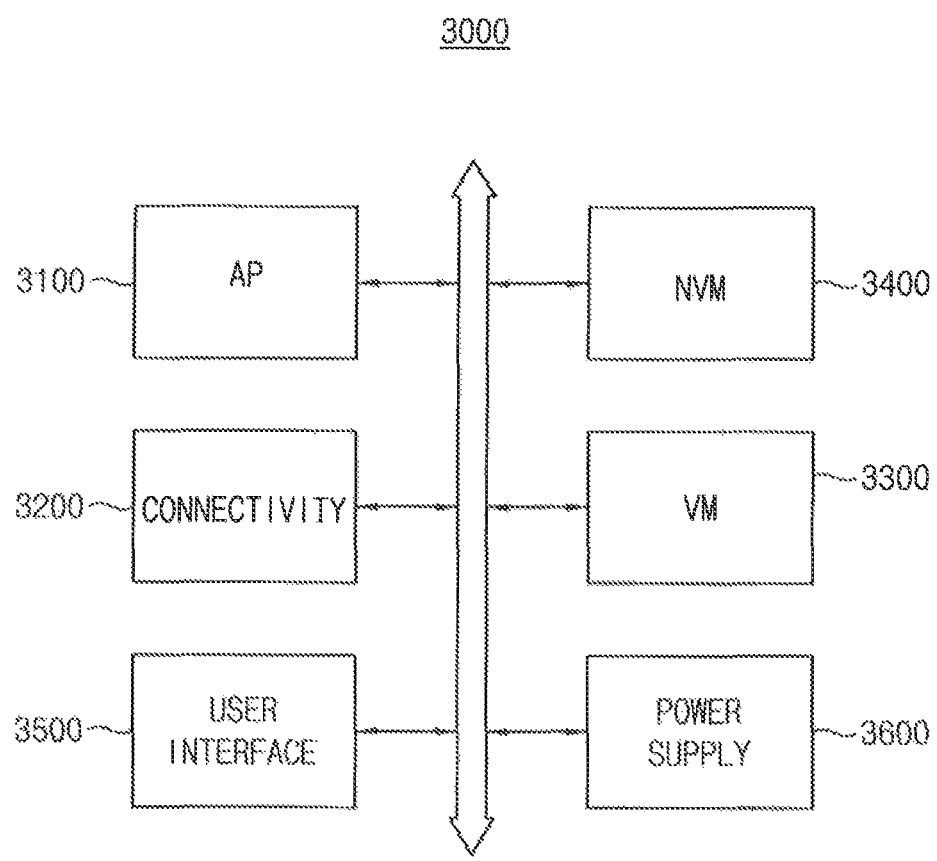
FIG. 31 is a block diagram illustrating a mobile system according to an exemplary embodiment of the inventive concept.

FIG. 31 is a block diagram illustrating a mobile system according to an exemplary embodiment of the inventive concept.

Referring to FIG. 31, a mobile system 3000 includes an application processor 3100, a connectivity unit 3200, a volatile memory device VM 3300, a nonvolatile memory device NVM 3400, a user interface 3500, and a power supply 3600 connected via a bus.

The application processor 3100 may execute applications such as a web browser, a game application, a video player, etc. The connectivity unit 3200 may perform wired or wireless communication with an external device. The volatile memory device 3300 may store data processed by the application processor 3100, or may operate as a working memory. For example, the volatile memory device 3300 may be a DRAM, such as a double data rate synchronous dynamic random access memory (DDR SDRAM), a low power DDR (LPDDR) SDRAM, a graphics DDR (GDDR) SDRAM, a Rambus DRAM (RDRAM), etc. The nonvolatile memory device 3400 may store a boot image for booting the mobile system 3000 and other data. The user interface 3500 may include at least one input device, such as a keypad, a touch screen, etc., and at least one output device, such as a speaker, a display device, etc. The power supply 3600 may supply a power supply voltage to the mobile system 3000. In an exemplary embodiment of the inventive concept, the mobile system 3000 may further include a camera image processor (CIS), and/or a storage device, such as a memory card, a solid state drive (SSD), a hard disk drive (HDD), a compact disc read only memory (CD-ROM), etc.

The volatile memory device 3300 and/or the nonvolatile memory device 3400 may be implemented in a stacked structure as described with reference to FIGS. 1 through 30. The stacked structure may include a plurality of memory semiconductor dies connected through through-silicon vias and the above-described calculation units may be formed in at least one of the memory semiconductor dies.

As described above, the stacked memory device, the memory system including the stacked memory device and the method of operating a stacked memory device according to exemplary embodiments of the inventive concept may reduce data amounts exchanged between the stacked memory device, the logic semiconductor die and the external device. For example, the stacked memory device, the memory system including the stacked memory device and the method of operating a stacked memory device according to exemplary embodiments of the inventive concept perform memory-intensive or data intensive data processing in parallel by the plurality of calculation units included in the memory semiconductor die. Therefore, data processing time and power consumption is reduced. Furthermore, the data processing time and the power consumption of MLP, RNN, CNN, etc. may be reduced by increasing the memory bandwidth of kernel weights for matrix-vector multiplication through the plurality of calculation units disposed in the memory bank and by increasing the memory bandwidth of activations for the matrix-vector multiplication through broadcasting.

Exemplary embodiments of the present inventive concept may be applied to any devices and systems including a memory device requiring a refresh operation. For example, the present inventive concept may be applied to systems such as a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

While the present inventive concept has been particularly shown and described with reference to exemplary embodiments thereof, it will be apparent to those of ordinary skill in the art that various changes in form and detail may be made therein without departing from the spirit and scope of the present inventive concept as defined by the following claims.

What is claimed is:

1. A stacked memory device, comprising:
a logic semiconductor die;
a plurality of memory semiconductor dies stacked with the logic semiconductor die, wherein each of the memory semiconductor dies includes a memory integrated circuit and one or more of the memory semiconductor dies is a calculation semiconductor die including a calculation unit; and
through-silicon vias electrically connecting the logic semiconductor die and the plurality of memory semiconductor dies;
wherein each of the calculation units is configured to perform calculations based on broadcast data and internal data and to generate calculation result data, wherein the broadcast data is commonly provided to the calculation semiconductor dies through the through-silicon vias, and the internal data is respectively read from the memory integrated circuits of the calculation semiconductor dies.

2. The stacked memory device of claim 1, wherein each of the memory semiconductor dies includes a plurality of memory banks and the calculation units are disposed in the memory banks included in the calculation semiconductor dies.

3. The stacked memory device of claim 2, wherein the calculation units included in the memory banks of the calculation semiconductor dies commonly receive the broadcast data and perform the calculations based on the broadcast data simultaneously.

4. The stacked memory device of claim 2, wherein each of the memory banks includes a plurality of data blocks and each of the calculation units is assigned with respect to a predetermined number of the data blocks.

5. The stacked memory device of claim 1, wherein each of the calculation units includes first input terminals for receiving the internal data and second input terminals for receiving the broadcast data, the first input terminals are connected to output terminals of an input-output sense amplifier that amplifies signals on global input-output lines and the second input terminals are connected to input terminals of an input-output driver that drives the global input-output lines.

6. The stacked memory device of claim 1, wherein at least one of the memory semiconductor dies is an input-output semiconductor die that does not include the calculation units.

7. The stacked memory device of claim 6, wherein the broadcast data are transferred directly from the input-output semiconductor die to the calculation semiconductor dies without passing through the logic semiconductor die.

8. The stacked memory device of claim 6, wherein the input-output semiconductor die simultaneously drives data buses with the broadcast data and each of the calculation semiconductor dies receives the broadcast data through a corresponding one of the data buses.

9. The stacked memory device of claim 6, wherein the input-output semiconductor die drives a data bus corresponding to the input-output semiconductor die with the broadcast data and each of the calculation semiconductor dies receives the broadcast data through the data bus corresponding to the input-output semiconductor die.

10. The stacked memory device of claim 6, wherein the calculation result data are transferred from the calculation semiconductor dies to the logic semiconductor die, and then, transferred from the logic semiconductor die to the input-output semiconductor die.

11. The stacked memory device of claim 10, wherein the calculation result data are simultaneously transferred from the calculation semiconductor dies to the logic semiconductor die through data buses respectively corresponding to the calculation semiconductor dies, and the calculation result data are sequentially transferred from the logic semiconductor die to the input-output semiconductor die by a time-division scheme through the data bus corresponding to the input-output semiconductor die.

12. The stacked memory device of claim 6, wherein the calculation result data are transferred directly from the calculation semiconductor dies to the input-output semiconductor die without passing through the logic semiconductor die.

13. The stacked memory device of claim 12, wherein each of the calculation semiconductor dies drives a corresponding data bus with the calculation result data and the input-output semiconductor die receives the calculation result data sequentially through the data buses corresponding to the calculation semiconductor dies.

14. The stacked memory device of claim 12, wherein the calculation semiconductor dies sequentially drive a data bus corresponding to the input-output semiconductor die with the calculation result data, and the input-output semiconductor die sequentially receives the calculation result data through the data bus corresponding to the input-output semiconductor die.

15. The stacked memory device of claim 1, wherein all of the memory semiconductor dies are the calculation semiconductor dies that include the calculation units.

16. The stacked memory device of claim 2, wherein each of the calculation semiconductor dies further includes a plurality of bank adders, and each of the bank adders sums outputs of the calculation units in each of the memory banks to generate bank result signals.

17. The stacked memory device of claim 1, wherein each of the calculation units includes:
 a multiplication circuit configured to multiply the broadcast data and the internal data; and
 an accumulation circuit configured to accumulate outputs of the multiplication circuit to provide the calculation result data.

18. The stacked memory device of claim 1 wherein the logic semiconductor die further includes a data transform logic configured to process data provided from the memory semiconductor dies or data provided from an external device.

* * * * *